United States Patent
Nakatani et al.

(10) Patent No.: US 7,842,947 B2
(45) Date of Patent: Nov. 30, 2010

(54) ORGANIC EL DISPLAY PANEL AND MANUFACTURING METHOD THEREOF

(75) Inventors: Shuhei Nakatani, Osaka (JP); Hidehiro Yoshida, Osaka (JP); Kiyohiko Takagi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/669,094

(22) PCT Filed: Jun. 2, 2009

(86) PCT No.: PCT/JP2009/002475

§ 371 (c)(1),
(2), (4) Date: Jan. 14, 2010

(87) PCT Pub. No.: WO2009/147838

PCT Pub. Date: Dec. 10, 2009

(65) Prior Publication Data

US 2010/0181559 A1    Jul. 22, 2010

(30) Foreign Application Priority Data

Jun. 6, 2008   (JP) .............................. 2008-149388

(51) Int. Cl.
*H01L 51/20*   (2006.01)
(52) U.S. Cl. .................... 257/40; 257/E51.022; 438/34
(58) Field of Classification Search .................. None
See application file for complete search history.

(56) References Cited

U.S. PATENT DOCUMENTS

| | | | |
|---|---|---|---|
| 6,420,834 B2 * | 7/2002 | Yamazaki et al. | 315/169.3 |
| 7,012,367 B2 * | 3/2006 | Seki | 313/506 |
| 7,091,660 B2 | 8/2006 | Park et al. | |
| 7,294,856 B2 * | 11/2007 | Ito et al. | 257/72 |
| 7,378,679 B2 * | 5/2008 | Toyoda | 257/3 |
| 7,781,963 B2 * | 8/2010 | Yoshida et al. | 313/506 |
| 2004/0140759 A1 | 7/2004 | Park et al. | |
| 2007/0264814 A1 * | 11/2007 | Hirai et al. | 438/617 |
| 2008/0063949 A1 | 3/2008 | Inoue | |
| 2008/0205953 A1 | 8/2008 | Takemoto et al. | |
| 2009/0058268 A1 | 3/2009 | Yoshida et al. | |
| 2009/0224664 A1 | 9/2009 | Yoshida et al. | |
| 2009/0284135 A1 | 11/2009 | Yoshida et al. | |
| 2009/0284146 A1 | 11/2009 | Yoshida et al. | |
| 2009/0321725 A1 | 12/2009 | Yoshida et al. | |

FOREIGN PATENT DOCUMENTS

EP    2077698    7/2009

(Continued)

*Primary Examiner*—Benjamin P Sandvik
(74) *Attorney, Agent, or Firm*—Greenblum & Bernstein, P.L.C.

(57) ABSTRACT

Disclosed is an organic EL display panel which includes: a substrate; a linear first bank which is disposed over the substrate and defines a linear region; a second bank which defines two or more pixel regions arranged in the linear region; a pixel electrode disposed in the pixel region; a linear organic layer which is formed by coating method in the linear region over the pixel electrode and second bank; and a counter electrode over the organic layer, wherein the first bank is larger in height than the second bank, the first and second banks are made of resin, anisole contact angle at the top of the first bank is 30-60°, and anisole contact angle at the top of the second bank is 5-30°.

11 Claims, 16 Drawing Sheets

FOREIGN PATENT DOCUMENTS

| | | |
|---|---|---|
| JP | 11-329741 | 11/1999 |
| JP | 2005-222776 | 8/2005 |
| JP | 2005-267984 | 9/2005 |
| JP | 2006-41027 | 2/2006 |
| JP | 2006-71872 | 3/2006 |
| JP | 2006-86128 | 3/2006 |
| JP | 2006-286309 | 10/2006 |
| JP | 2006-294446 | 10/2006 |
| JP | 2006-305331 | 11/2006 |
| JP | 2007-44582 | 2/2007 |
| JP | 2008-243406 | 10/2008 |
| JP | 2009-117392 | 5/2009 |
| WO | 2006/41027 | 4/2006 |
| WO | 2009/22555 | 2/2009 |

* cited by examiner

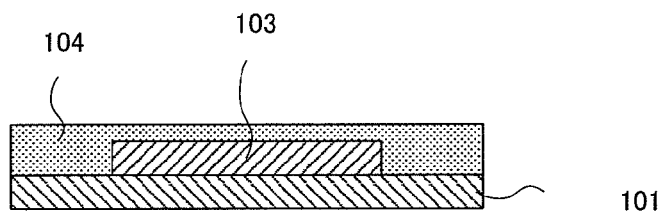
FIG.4A
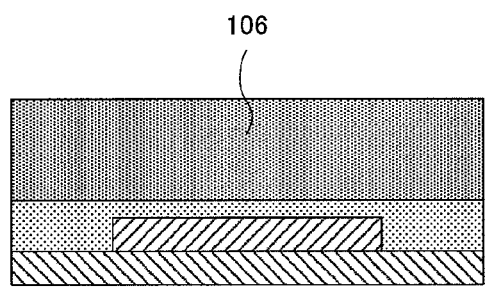
FIG.4B
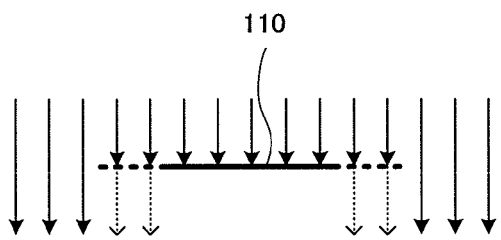
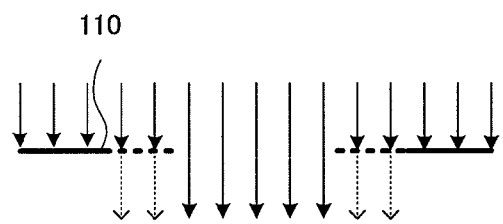
FIG.4C
FIG.4C'
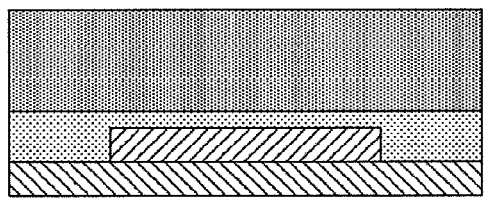
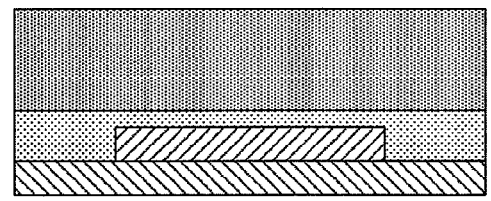
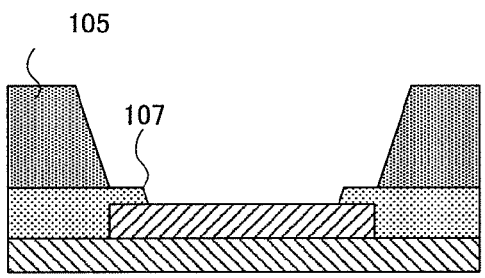
FIG.4D

ORGANIC EL DISPLAY PANEL AND MANUFACTURING METHOD THEREOF

TECHNICAL FIELD

The present invention relates to an organic EL display panel and a manufacturing method of the same.

BACKGROUND ART

An organic EL display panel refers to a display panel which includes light-emitting devices exploiting electroluminescence (EL) of organic compounds. Specifically, the organic EL display panel has EL devices each including a pixel electrode, an organic luminescent layer disposed over the pixel electrode, and a counter electrode disposed over the organic luminescent layer. Organic EL materials used for the organic luminescent layer can be broadly classified into two types: combinations of low-molecular weight compounds (combinations of host and dopant materials); and organic polymer compounds. Examples of organic polymer compounds include polyphenylenevinylene (abbreviated as "PPV") and its derivatives. An organic EL display panel that utilizes organic polymer compounds can be driven at relatively low voltage and consumes less power, lending itself to development of large display panels. Under this circumstance, extensive research activities are underway.

With a printing technology such as inkjet printing, organic polymer compounds are applied to corresponding pixels according to their luminescence color—R, G or B. For example, printing is accomplished by discharging a polymer ink containing an organic polymer compound and solvent from an inkjet head. When printing such a polymer ink on certain pixels, it is necessary to prevent the polymer ink from entering unintendedly into adjacent pixels.

In order to prevent an organic EL material-containing ink from entering into adjacent pixels of different colors, a method is suggested in which walls (banks) are provided in such a way as to surround all four sides of every pixel and the ink is dropped in regions defined by the banks (see, e.g., Patent Document 1).

Nevertheless, organic EL display panels manufactured with this method have had the disadvantage of non-uniform organic luminescent layer thickness because discrete organic luminescent layers are formed in regions defined by banks. Namely, non-uniform thickness is caused by the surface tension of the applied ink, which pulls more liquid to the edges of the banks. Non-uniformity in organic luminescent layer thickness reduces the luminescence efficiency and, accordingly, lifetime of an organic EL display panel.

FIG. 1A shows an organic EL display panel structure which has succeeded in overcoming the above disadvantage (see, e.g., Patent Document 2). FIG. 1A is a plan view of the organic EL display panel disclosed by Patent Document 2. FIG. 1B is a III-III line sectional view of the organic EL display panel shown in FIG. 1A. FIG. 1C is a partially enlarged view of FIG. 1B. As shown in FIGS. 1A to 1C, the organic EL display panel includes glass substrate 1, first electrode layer 2, first banks 4, second banks 3, hole injection layers 5, and organic luminescence layers 6. First bank 1 and second bank 3 are both made of resin.

First banks 1 define linear regions 40. Each linear region 40 has a row of organic EL devices and defines linear organic luminescence layer 6. Second banks 3 define pixel regions 30, which define regions of hole injection layer 5.

In the organic EL display panel shown in FIGS. 1A to 1C each organic luminescent layer covers multiple pixel regions (organic EL devices), whereby the thickness of each organic luminescent layer can be made uniform in lengthwise direction. To achieve this configuration, organic luminescent layers 6 are formed so as to also cover second banks 3.

A method is known, to control the "pinning" of functional layers (hole injection layer and organic luminescent layer) by employing a two-layered resin bank defining the functional layers obtained by coating method (see, e.g., Patent Document 3). In the organic EL device disclosed by Patent Document 3, a first resin layer of a bank (lower bank layer) is made smaller in width than a second resin layer (upper bank layer) to provide a difference in bank height. This bank level difference controls "pinning" of the functional layers to provide uniform thick functional layers.

Moreover, methods are known in which a two-layered bank is employed whose upper bank is made lyophobic and whose lower bank is made lyophilic, so that functional layer material solution can sufficiently spread over the region defined by the bank (see Patent Documents 4-10). In the organic EL devices disclosed by Patent Documents 4-10, the lower bank is made lyophilic by employing a lyophilic material such as $SiO_2$ as a lower bank material. This increases compatibility between the bank and functional layer material solution, allowing the applied functional layer material solution to spread over the entire region defined by the bank.

Patent Document 1: Japanese Patent Application Publication No. 2006-86128

Patent Document 2: U.S. Pat. No. 7,091,660

Patent Document 3: Japanese Patent Application Publication No. 2006-41027

Patent Document 4: Japanese Patent Application Publication No. 2006-286309

Patent Document 5: Japanese Patent Application Publication No. 2006-305331

Patent Document 6: Japanese Patent Application Publication No. 2006-71872

Patent Document 7: Japanese Patent Application Publication No. H11-329741

Patent Document 8: Japanese Patent Application Publication No. 2007-44582

Patent Document 9: Japanese Patent Application Publication No. 2005-222776

Patent Document 10: Japanese Patent Application Publication No. 2006-294446

DISCLOSURE OF INVENTION

Problems to be Solved by the Invention

When the wettability of the second bank of an organic EL display panel such as that shown in FIGS. 1A and 1B is low, the organic EL material-containing ink applied thereon may be repelled. When the second bank is ink repellent, it results in failure to form uniform thick organic luminescent layers. Accordingly, the second bank is required to have high wettability at its upper surface.

The first bank, on the other hand, is required to have low wettability as it needs to define regions for the organic EL material-containing ink to be applied. Thus, when forming linear organic luminescent layers each covering a row of organic EL devices, the first bank needs to have lower wettability than the second bank.

Patent Document 2 which discloses the organic EL display panel shown in FIGS. 1A to 1C, however, fails to disclose any specific means for decreasing the wettability of the first bank to a level lower than that of the second bank.

One possible method of lowering the second bank wettability is to employ a lyophilic inorganic film for second bank 3, as described in Patent Documents 4-10. However, unfortunately, second bank 3 formed of an inorganic film results in increased process steps and production costs.

Further, in the organic EL display panel disclosed by Patent Document 2, level difference X between second bank 3 and hole injection layer 5 is large as shown in FIG. 1C. This is because in this organic EL display panel second bank 3 needs to have a predetermined height enough to define hole injection layers which are formed by coating method. Thus, linear regions 40 prior to formation of organic luminescent layers are not flat; uniform organic luminescent layers cannot be formed when linear regions 40 do not have flat surface.

There may be no necessity to provide second bank 3 if the hole injection layer formed by coating method is replaced by one formed by thin film deposition or if no hole injection layer is provided. However, if second bank 3 is not provided as a bank which defines pixel regions 30, there is concern that linear regions 40 become more rugged due to level differences between the substrate surface and pixel electrode or hole injection layer surface.

It is therefore an object of the present invention to provide a long-life organic EL display panel with a high light emission efficiency by making uniform the thicknesses of linear organic luminescent layers.

Means for Solving the Problem

A first aspect of the present invention relates to organic EL display panels below.

[1] An organic EL display panel including: a substrate; a linear first bank which is disposed over the substrate and defines a linear region; a second bank which defines two or more pixel regions arranged in the linear region; a pixel electrode disposed in the pixel region; a linear organic layer which is formed by coating method in the linear region over the pixel electrode and second bank; and a counter electrode on the organic layer, wherein the first bank is larger in height than the second bank, the first and second banks are made of resin, anisole contact angle at the top of the first bank is 30-60°, and anisole contact angle at the top of the second bank is 5-30°.

[2] The organic EL display panel according to [1], wherein the height of the first bank from a surface of the substrate is 0.5-3 µm.

[3] The organic EL display panel according to [1] or [2], wherein a bottom surface of the organic layer contacts the pixel electrode, and the height of the second bank from a surface of the pixel electrode is −0.1 µm to +0.4 µm.

[4] The organic EL display panel according to [1] or [2], further comprising a separate hole injection layer disposed over the pixel electrode in each of the pixel regions, wherein a bottom surface of the organic layer contacts the hole injection layer.

[5] The organic EL display panel according to [4], wherein the hole injection layer contains a transition metal oxide, and the height of the second bank from a surface of the hole injection layer is −0.1 µm to +0.4 µm.

[6] The organic EL display panel according to [4], wherein the hole injection layer contains polyethylenedioxythiophene, and the height of the second bank from a surface of the pixel electrode is 0.1-0.5 µm.

[7] The organic EL display panel according to any one of [1] to [6], wherein a material of the first bank is fluorine resin.

[8] The organic EL display panel according to [7], wherein the first bank has a gradient of fluorine concentration along the height thereof, and the fluorine concentration is higher at the top than at the bottom surface thereof.

[9] The organic EL display panel according to [7] or [8], wherein a material of the second bank is fluorine resin.

[10] The organic EL display panel according to [9], wherein the fluorine concentration at the top of the first bank is higher than the fluorine concentration at the top of the second bank.

A second aspect of the present invention relates to manufacturing methods of an organic EL display panel below.

[11] A method of manufacturing an organic EL display panel including: providing a substrate on which a pixel electrode is arranged; forming a linear first bank which defines a linear region, and a second bank which defines two or more pixel regions arranged in the linear region over the substrate; applying a material solution containing an organic EL material in the linear region to form a linear organic layer; and forming a counter electrode over the organic layer, wherein the first bank is larger in height than the second bank, the first and second banks are made of resin, anisole contact angle at the top of the first bank is 30-60°, and anisole contact angle at the top of the second bank is 5-30°.

[12] The method according to [11], wherein the step of forming the first and second banks includes: patterning a resin film on the substrate; and baking the patterned resin film.

[13] The method according to [12], wherein the step of patterning the resin film includes: forming on the substrate photosensitive resin film A containing a material of the second bank; forming on the photosensitive resin film A photosensitive resin film B which contains a material of the first bank and has different sensitivity than the photosensitive resin film A; and exposing the photosensitive resin films A and B through a mask having different degrees of light transmittance, and developing the exposed photosensitive resin films A and B.

[14] The method according to [12], wherein the step of patterning the resin film includes: forming on the substrate a photosensitive resin film containing a fluorine compound; and exposing the photosensitive resin film through a halftone mask having different degrees of light transmittance, and developing the exposed photosensitive resin.

Advantageous Effect of the Invention

The present invention can provide an organic EL display panel with uniform thick organic layers because coating regions have high wettability and flat surface.

BRIEF DESCRIPTION OF DRAWINGS

FIGS. 4A to 4D show an example of a method of fabricating first and second banks;

BEST MODE FOR CARRYING OUT THE INVENTION

1. Organic EL Display Panel

Figure 1A:
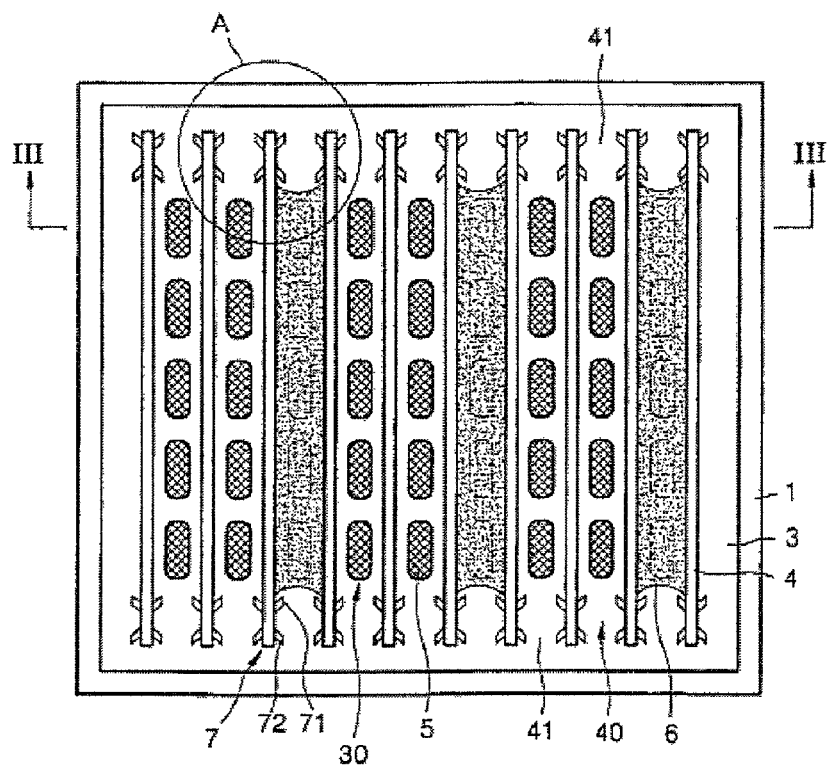
FIGS. 1A to 1C are a plan view and sectional views, respectively, showing a conventional organic EL display panel.
Figure 1B:
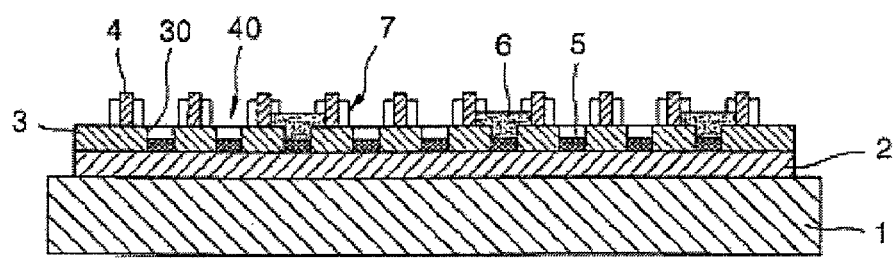

An organic EL display panel of the present invention includes a matrix of organic EL devices arranged on a substrate. Each organic EL device includes a pixel electrode, an organic layer disposed over the pixel electrode; and a counter electrode disposed over the organic layer. In the present invention the organic layer is formed by coating method.

More specifically, an organic EL display panel of the present invention includes 1) a substrate, 2) pixel electrodes; 3) first and second banks disposed on the substrate, 4) organic layers disposed in regions defined by the first bank, and 5) a counter electrode disposed over the organic layers.

An organic EL display panel of the present invention may be either of a passive-matrix panel which has a grid of linear pixel electrodes, or an active-matrix panel which has a separate pixel electrode for each organic EL device. Moreover, the organic EL display panel may be either of bottom emission type or top emission type. The following describes respective components of an organic EL display panel of the present invention.

1) Substrate

The material of a substrate of an organic EL display panel of the present invention varies depending on whether the organic display panel is of top mission type or bottom emission type. For example, in the case of bottom emission type, the substrate needs to be transparent. Thus, in this case, the substrate material may be selected from glass, transparent resins, etc. In the case of top emission type, on the other hand, the substrate needs not to be transparent and, therefore, is only required to be made of insulating material.

When an organic EL display panel of the present invention is an active matrix display panel, the substrate incorporates therein thin film transistors for driving organic EL devices (driving TFTs). The source electrode or drain electrode of a driving TFT is connected to a pixel electrode described later (see FIG. 7A).

2) Pixel Electrode

A pixel electrode is a conductive member arranged on the substrate. In organic EL display panels, pixel electrode generally serves as anode, but may also serve as cathode. The pixel electrode is disposed in the pixel region described later.

In the case of passive-matrix display panel, multiple linear pixel electrodes are arranged on a substrate. The multiple linear pixel electrodes are preferably parallel each other. In the case of active matrix display panel, separate pixel electrodes are arranged for respective organic EL devices.

Bottom emission type organic display panels require transparency in pixel electrodes. Thus, examples of materials of the pixel electrode include indium tin oxide (ITO), indium zinc oxide (IZO), and zinc oxide (ZnO).

On the other hand, top emission type organic EL display panels require light reflectivity in pixel electrodes. Thus, examples of materials of the pixel electrode include silver-containing alloys, more specifically silver-palladium-copper alloys (also referred to as "APC") and silver-ruthenium-gold alloys (also referred to as "ARA"); molybdenum/chrome (MoCr) alloys; nickel/chrome (NiCr) alloys; and aluminum alloys such as aluminum-neodymium (Al—Nd) alloys. Moreover, reflective pixel electrodes may have an ITO film or indium zinc oxide (IZO) film attached on their surface.

A hole injection layer may be disposed on a pixel electrode. The hole injection layer has a function of help injecting holes into an organic layer from the pixel electrode. Thus, the hole injection layer is disposed between the pixel electrode and the organic layer (see FIGS. 7A and 8B).

Examples of the material of the hole injection layer include poly(3,4-ethylenedioxythiophene) doped with polyethylene sulfonate (referred to as "PEDOT-PSS") and derivatives thereof, and transition metal oxides. Among them, transition metal oxides are preferable.

Examples of transition metals include tungsten, molybdenum, titanium, vanadium, ruthenium, manganese, chrome, nickel, iridium, silver-palladium-copper alloys (APC), and combinations thereof. Preferred hole injection material is tungsten oxide ($WO_x$) or molybdenum oxide ($MoO_x$).

The hole injection layer thickness is generally 10-100 nm and may be about 50 nm.

Figure 1C:
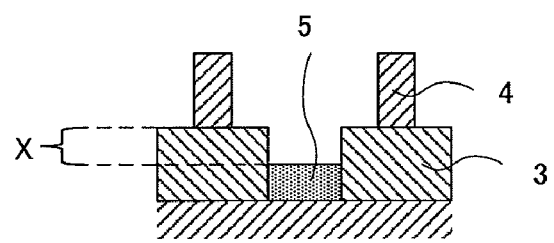

Because a PEDOT-PSS-containing hole injection layer is formed by coating method, there has been required to employ a later-described second bank for defining the region in which the hole injection layer is to be formed (see Patent Document 2). Thus, such a second bank is required to have a certain height, leading to significant level differences in a coating region described later (see FIG. 1C). On the other hand, as a hole injection layer made of transition metal oxide can be formed by sputtering or vapor deposition, there is no need to provide a second bank for defining a region for the hole injection layer. Accordingly, when a hole injection layer is formed by sputtering or vapor deposition of transition metal oxide, the second bank can be made relatively low in height, reducing level differences in a coating region which result in planarization of the coating region.

The hole injection layer may not be provided as long as holes can be efficiently injected into the organic layer from the pixel electrode. In this case, the organic layer is disposed on the pixel electrode. As described above, in the present invention, there are three different cases regarding the dispositions of pixel electrode, organic layer and hole injection layer: i) a case where an organic layer is disposed on a pixel electrode; ii) a case where an organic layer is disposed on a hole injection layer made of transition metal oxide; and iii) a case where an organic layer is disposed on a PEDOT-PSS-containing hole injection layer.

3) First Bank and Second Bank

First and second banks are barriers disposed on a substrate. In the present invention the materials of the first and second banks contain resin.

First Bank

A first bank is a barrier disposed on a substrate for defining a later-described coating region in which an organic layer is to be applied. The first bank is provided in the form of multiple linear banks on a substrate, defining linear regions over the substrate (see FIG. 6A). In the linear region an organic layer described later is applied. Hereinafter, a linear region defined by linear banks (first bank) is referred to as a "coating region." In one coating region defined by the first bank, there is provided a row of pixel regions (see FIG. 6A). Herein, "pixel region" means a region occupied by one organic EL device.

Preferably, linear first banks run in parallel with each other. Moreover, when linear pixel electrodes are formed (i.e., in the case of passive-matrix organic EL display panel), the linear banks preferably run orthogonal to the lines of pixel electrodes.

The height of the first bank from the substrate surface is preferably 0.5-3 μm, more preferably 0.8-1.2 μm. As will be described later, in an active-matrix organic EL display panel, all organic EL devices share one counter electrode. However, when the first bank height is more than 3 μm, there is concern that the counter electrode is segmented by the first bank, which may in turn result in failure to form a counter electrode which is shared by every organic EL device. When the bank height is less than 0.5 μm, there is concern of leakage of ink applied in regions defined by the bank.

Preferably, the first bank has a forward tapered shape. As used herein "forward tapered shape" means that the side surface of the bank is inclined in such a way that the bank bottom area is larger than the bank upper area (see FIG. 7A). When the bank shape is tapered in this way, the taper angle is preferably 20-80°, more preferably 30-45°.

The first bank material is not particularly limited as long as it is a resin; it is preferably a fluorine resin. Examples of fluorine compounds contained in fluorine resins include vinylidene fluoride, vinyl fluoride, ethylene trifluoride, and fluorinated resins such as copolymers thereof. Examples of resins contained in fluorine resins include phenol-novolac resins, polyvinylphenol resins, acrylic resins, methacrylic resins, and combinations thereof.

As described above, the first bank defines a region in which an organic material-containing ink is to be applied, thereby preventing ink leakage of the ink. Thus, the upper surface of the first bank has low wettability. Herein, "low wettability" means that the contact angle of organic solvent such as anisole or cyclohexylbenzene is 30-60°. Herein "upper surface" means a bank surface including the bank top.

The first bank preferably has higher wettability at the bottom bank surface than at the bank upper surface. By decreasing the wettability of the bank upper surface to a level lower than that of the bank bottom surface, the first bank exerts its inherent function that low wettability at the bank upper surface suppresses leakage of organic material solution, and at the same time, high wettability at the bank bottom allows the solution to be completely applied in the entire region defined by the first bank, i.e., to the boundary between the first bank and the region defined by the first bank.

Bank wettability primarily depends on the concentration of fluorine atoms. Thus, in order to reduce the wettability of bank upper surface and increase the wettability of bank bottom surface, it is only necessary to make fluorine concentration higher at the bank upper surface than at the bank bottom surface. More specifically, the fluorine concentration at the top of the first bank is preferably 4-10 atom %, and the fluorine concentration at the bottom surface of the first bank is preferably 0-3 atom %. Fluorine concentration can be measured by X-ray photoelectron spectroscopy (also referred to as "XPS" or "ESCA"). Examples of X-ray photoelectron spectroscopy analyzer include PHI Quantera SXM (ULVAC-PHI, Inc.).

Bank with a higher fluorine concentration at the upper surface and a lower fluorine concentration at the bottom surface as described above can be prepared by baking treatment of a fluorine resin film which has been patterned into desired shape.

Table 1 shows relationships among thickness (height) of baked fluorine resin film, fluorine concentration at resin film surface and water contact angles and anisole contact angles at resin film surface. Contact angles of water and anisole were measured using LCD Glass Cleanness & Treatment Analyzer (Kyowa Interface Science Co., Ltd.).

TABLE 1

| Thickness (μm) | Water contact angle | Organic solvent contact angle | Fluorine conc. (atom %) |
|---|---|---|---|
| 1 | 81.2° | 45.5° | 7.5 |
| 0.9 | 78.9° | 43.0° | 6.9 |
| 0.8 | 76.5° | 40.6° | 6.3 |
| 0.7 | 74.1° | 38.2° | 5.6 |
| 0.6 | 71.7° | 35.7° | 5.0 |
| 0.5 | 69.4° | 33.3° | 4.3 |
| 0.4 | 67.0° | 30.8° | 3.7 |
| 0.3 | 64.6° | 28.4° | 3.0 |
| 0.2 | 62.2° | 25.9° | 2.4 |
| 0.1 | 59.9° | 23.5° | 1.7 |

As shown in Table 1, fluorine resin films have higher fluorine concentrations at their surface with increasing film thickness (height). Since the wettability of fluorine resin primarily depends on the fluorine concentration, contact angles of water and organic solvent increase (wettability decreases) with increasing fluorine concentration.

For example, a 1 μm-thick fluorine resin film has, at a surface thereof, a fluorine concentration of 7.5 atom %, water contact angle of 81.2°, and anisole contact angle of 45.5°.

A 0.3 μm-thick fluorine resin film has, at a surface thereof, a fluorine concentration of 3.0 atom %, water contact angle of 64.6°, and anisole contact angle of 28.4°.

By making the shape of the fluorine resin bank forwardly tapered, a gradient of fluorine concentration can be obtained along the height of the first bank.

Figure 2:
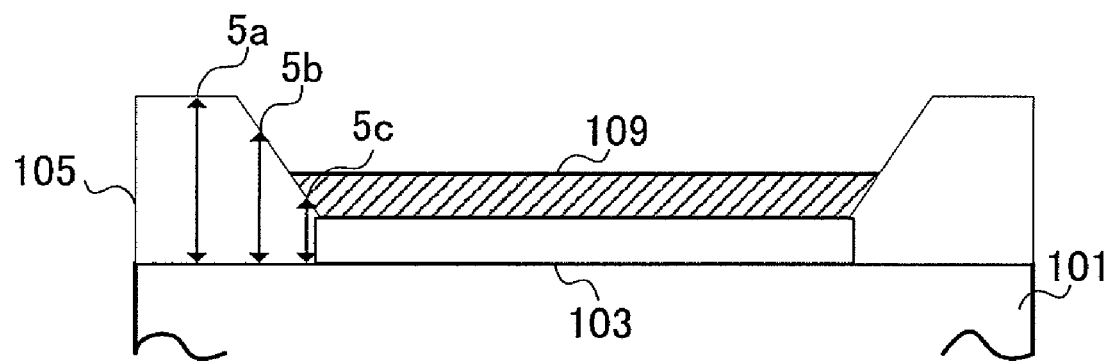
FIG. 2 is a sectional view of an organic EL device in an organic EL display panel according an embodiment of the present invention.

FIG. 2 is a sectional view showing an organic EL device having forwardly tapered bank 105. When bank 105 has a forward tapered shape as shown in FIG. 2, a height gradient is obtained along its wall surface. More specifically, referring to FIG. 2, bank height decreases in the order of 5a, 5b, and 5c.

As shown in Table 1, the upper surfaces of lower banks have lower fluorine densities, whereas the upper surfaces of higher banks have higher fluorine densities. Accordingly, referring to forwardly tapered bank 105 shown in FIG. 2, the portion denoted by 5a (higher bank portion) has a relatively high fluorine concentration, whereas the portion denoted by 5c (lower bank portion) has a relatively low fluorine concentration. Thus, in bank 105, fluorine concentration decreases in the order of 5a, 5b, and 5c. In FIG. 2, 101 denotes a substrate, and 103 denotes an electrode.

In this way a gradient of fluorine concentration can be obtained along the height of the first bank, by making the shape of the first bank made of fluorine resin forwardly tapered. Moreover, a gradient of wettability can also be obtained along the bank height by producing a gradient of fluorine concentration along the height of the first bank. By applying an organic material solution in the region defined by the first bank having a gradient of wettability along its height, the organic layer can be formed with accuracy while ensuring more uniformity in their thickness.

When an organic EL display panel of the present invention is a passive-matrix panel, the first bank not only defines coating regions, but also may serve as a counter electrode separator. The counter electrode separator is a member for dividing a counter electrode described later; for example, it divides a counter electrode, which is formed over organic layers described later by vapor deposition or the like, into segments according to linear coating regions.

Second Bank

A second bank is disposed on a substrate and has a function of defining two or more pixel regions in each coating region (see FIGS. 6a and 6B) and planarizing the coating regions. As organic layer formed by coating method also covers the second bank in the present invention, the second bank is shorter in height than the first bank. The height of the second bank will be described later.

The wettability of the second bank at the upper surface is preferably high. The reason for this is that the upper surface of the second bank needs to have affinity for organic material solution because as described above the organic layer formed by coating method also covers the second bank. Herein, "wettability is high" means that the contact angle of organic solvent such as anisole or cyclohexylbenzene is 5-30° and water contact angle is 30-90°.

The present invention is characterized in that the first and second banks are both made of resin, but have different degrees of wettability as described above. By establishing this wettability difference, it is possible to form uniform thick linear organic layers by coating method.

In order to establish wettability difference between the first and second banks, it is only necessary to differentiate their resin compositions from each other. Herein, "to make the resin compositions different from each other" means to change the molecular structures of resin monomers, monomer ratios, additive amounts, etc.

In the case of differentiating the resin composition of the first bank from that of the second bank, A) first and second banks may be made of different materials, or B) first and second banks may be made of the same material.

A) In a Case where Different Materials are Used for First and Second Banks

When first bank material and second bank material are different, resins having higher wettability than resins for the first bank may be employed as a material for the second bank. Examples of resins with high wettability include fluorine-free polyimide resins and fluorine-free acrylic resins.

B) In a Case where the Same Material is Used for First Bank and Second Bank

In order to decrease the wettability of the upper surface of the first bank while increasing the wettability of the upper surface of the second bank even when using the same material for the first and second banks, it is only necessary to employ fluorine resins as the first bank material and second bank material.

As described above, the wettability of fluorine resin depends on its thickness (height) (see Table 1). In addition, as described above, the second bank is shorter in height than the first bank. Accordingly, even when the first bank material and second bank material are both fluorine resins, it is possible to reduce the wettability of the upper surface of the first bank and increase the wettability of the upper surface of the second bank.

When the first bank material and second bank material are both fluorine resins, the fluorine concentration at the top of the second bank is preferably 1-4 atom %.

Height of Second Bank

The height of the second bank varies depending on the kind of the layer contacting the bottom surface of an organic layer described later (hereinafter also referred to as a "underlying layer of organic layer"). As described above, in the present invention, there are three different cases regarding the dispositions of pixel electrode, organic layer and hole injection layer: i) a case where an organic layer is disposed on a pixel electrode; ii) a case where an organic layer is disposed on a hole injection layer made of transition metal oxide; and iii) a case where an organic layer is disposed on a PEDOT-PSS-containing hole injection layer. Thus, the underlying layer of organic layer corresponds to any one of the following members: i) pixel electrode, ii) hole injection layer made of transition metal oxide, and iii) PEDOT-PSS-containing hole injection layer. Hereinafter, descriptions will be provided as to the height of the second bank for each case.

i): In the Case where the Underlying Layer of Organic Layer is a Pixel Electrode When the underlying layer is a pixel electrode, the height of the second bank is preferably −0.1 µm to +0.4 µm, more preferably about 0 µm, from the pixel electrode surface. With this configuration the second bank needs not to define layers which are formed by coating method. Thus, it is possible to make the height of the second bank relatively low as measured from the pixel electrode surface. This enables planarization of the coating region and thereby organic layer thickness can be made more uniform.

In this case it may be possible not to provide the second bank as there is no need to define any layer formed by coating method. However, when no second bank is provided, there is concern that the linear region 40 becomes more rugged due to level differences between the substrate surface and pixel electrode or hole injection layer surface. For this reason, even when the second bank does not define any functional layer formed by coating method, it is preferable to provide the second bank for the purpose of planarization of the coating region.

ii): In the Case where the Underlying Layer of Organic Layer is a Hole Injection Layer Made of Transition Metal Oxide (See Embodiment 1)

When the underlying layer is a hole injection layer made of transition metal oxide, the height of the second bank is preferably −0.1 µm to +0.4 µm, more preferably about 0 µm, from the surface of the hole injection layer made of transition metal oxide. With this configuration the second bank needs not to define layers which are formed by coating method. Thus, it is possible to make the height of the second bank relatively low as measured from the surface of the hole injection layer made of transition metal oxide. This also enables planarization of coating regions and thereby organic layer thickness can be made more uniform.

iii): In the Case where the Underlying Layer of Organic Layer is a PEDOT-PSS-Containing Hole Injection Layer (see Embodiment 2)

When the underlying layer is a PEDOT-PSS-containing hole injection layer, the height of the second bank is preferably 0.1-0.5 µm from the pixel electrode surface. The PEDOT-PSS-containing hole injection layer is formed by coating method. Thus, when the underlying layer is a PEDOT-PSS-containing hole injection layer, it is required for the second bank to define a region in which a hole injection material solution (solution containing PEDOT-PSS and water) is to be applied. For this reason, in this case, the height of the second bank from the surface of the PEDOT-PSS-containing hole injection layer is high compared to those of cases (i) and (ii).

When the second bank defines regions in which a hole injection material solution (solution containing PEDOT-PSS and water) is to be applied, the wettability of the second bank is preferably lower at the upper surface than at the bottom surface. Moreover, preferably, the second bank has a gradient of wettability along the bank height, which enables precise formation of uniform thick PEDOT-PSS-containing hole injection layers.

4) Organic Layer

An organic layer contains at least an organic luminescent layer and is disposed over a pixel electrode. Organic layers are formed by applying an organic material solution in the linear coating region defined by the first bank; by applying an organic material solution (ink obtained by dissolving organic material into an organic solvent such as anisole or cyclobenzene) in the coating region by coating method such as inkjet printing, they are readily formed without damaging other materials. In the present invention, linear organic layers are formed in separate coating regions defined by the first bank in such a way that they each cover multiple organic EL devices. Thus, the organic layer is disposed not only on pixel regions, but also on the second bank.

Organic EL material to be contained in the organic luminescent layer may be either of polymer or low molecular weight as long as the organic luminescent layer can be prepared by coating method. In particular, polymeric organic EL material is preferable because by using polymeric organic EL material, the organic luminescent layer can be readily formed by coating method.

Examples of polymeric organic EL material include polyphenylenevinylene and its derivatives, polyacetylene and its derivatives, polyphenylene and its derivatives, poly para phenylene ethylene and its derivatives, poly(3-hexylthiophene) (P3HT) and its derivatives, and polyfluorene (PF) and its derivatives.

Examples of low-molecular weight organic EL material include tris(8-quinolinolate) aluminum.

The organic EL material is appropriately selected so that pixels each show their desired color—red (R), green (G), or blue (B). For example, green pixels are arranged next to red pixels; blue pixels are arranged next to the green pixels; red pixels are arranged next to the blue pixels; and so forth. The thickness of the organic luminescent layer is preferably about 50-150 μm (e.g., 60 μm).

The organic layer may further include an electron block layer, an electron transport layer and the like.

The electron block layer is made of polyaniline-based material or the like and has such functions as preventing the entry of electrons into the hole injection layer or efficiently transporting holes to the organic luminescent layer. The thickness of the electron block layer is generally 5-100 nm, preferably 10-50 nm (e.g., about 20 nm). No electron block layer may be provided as long as holes can be efficiently transported to the organic luminescent layer.

5) Counter Electrode

A counter electrode is a conducive member disposed over the organic layer. In organic EL display panels, the counter electrode generally serves as a cathode, but may also serve as an anode. The material of the counter electrode varies depending on whether the organic EL display panel is of bottom emission type or top emission type. In the case of top emission type, the counter electrode needs to be transparent; therefore, an ITO electrode or IZO electrode is preferable as a counter electrode. Further, Ba, Al, $WO_x$ and the like can be also employed. In the case of top emission type, an organic buffer layer may be disposed between the organic luminescent layer and counter electrode.

Meanwhile, in the case of bottom emission type, the counter electrode is not required to be transparent. Thus, materials thereof can be selected arbitrarily; examples include barium (Ba), barium oxide (BaO), and aluminum (Al).

It is only necessary to provide a counter electrode over the electron injection layer or organic luminescent layer disposed in pixel region. The counter electrode is generally provided so as to cover multiple coating regions. The counter electrode is typically formed by vapor deposition. Therefore, it is not necessarily for the counter electrode to be divided in segments corresponding to coating regions. More specifically, when each pixel electrode is independently controlled on an organic EL device basis like an active matrix panel, the counter electrode can be shared by multiple coating regions as TFT devices for driving the organic EL devices are independent from each other.

An electron injection layer made of barium (Ba), lithium fluoride (LiF) or the like may be provided between the counter electrode and organic layer.

An organic EL display panel of the present invention may be sealed by further providing a cover member (seal member) to a side on which a counter electrode is provided. The cover member prevents the entry of moisture or oxygen.

According to the present invention, coating regions have high wettability and flat surface as described above, which enables to provide an organic EL display panel having uniform thick organic layers.

2. Manufacturing Method of Organic EL Display Panel of the Present Invention

An organic EL display panel of the present invention may be manufactured with any method as long as the effect of the present invention is not impaired.

Figure 3A:
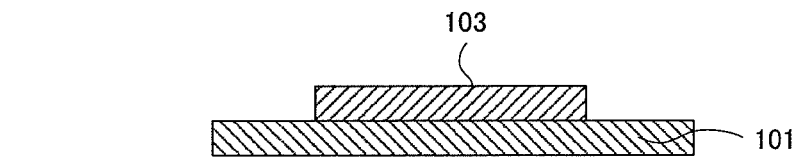
FIGS. 3A to 3E show a method of manufacturing an organic EL display panel according an embodiment of the present invention.
Figure 3B:
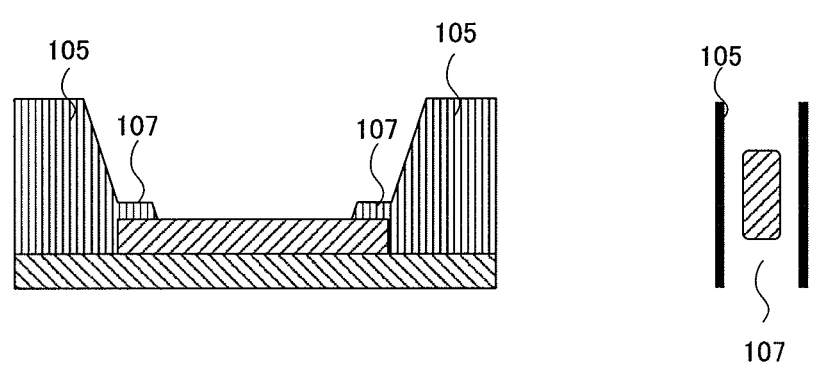
Figure 3C:
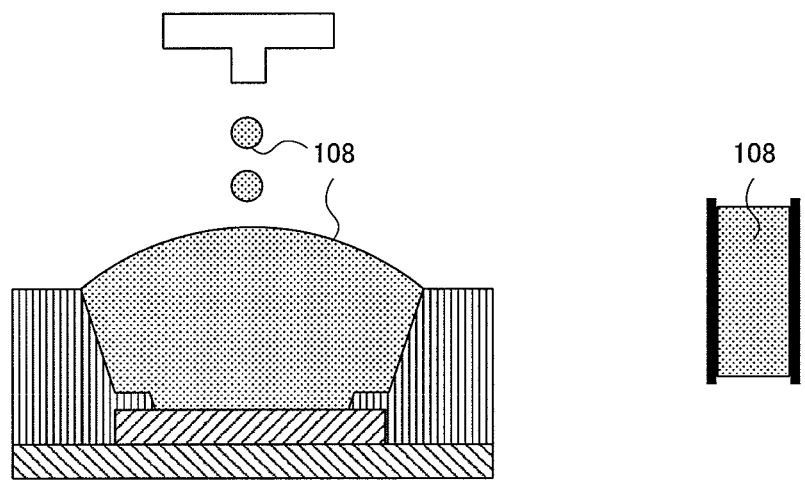
Figure 3D:
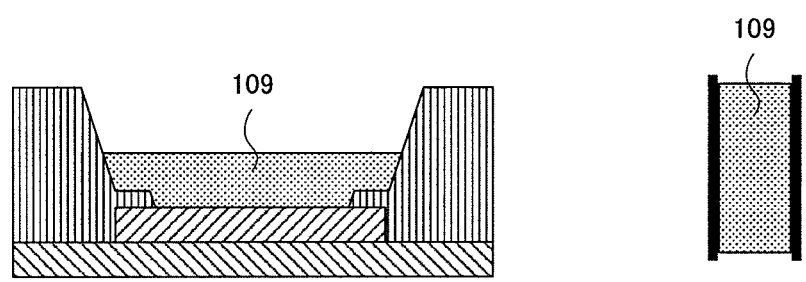
Figure 3E:
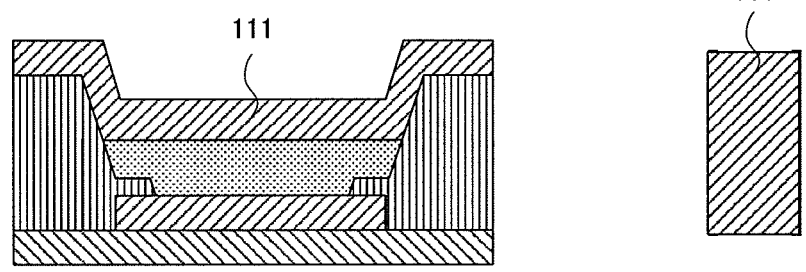

One example of a preferred manufacturing method includes:

1) a first step of providing a substrate on which a pixel electrode is arranged (FIG. 3A);

2) a second step of forming first and second banks on the substrate (FIG. 3B);

3) a third step of forming a linear organic layer in a coating region (FIGS. 3C and 3D); and 4) a fourth step of forming a counter electrode over the organic layer (FIG. 3E).

With reference to drawings, a preferred manufacturing method of an active matrix organic EL display panel of the present invention will be described below.

1) FIG. 3A shows the first step. In the first step substrate 101 on which pixel electrode 103 is arranged is provided. Substrate 101 may incorporate therein thin film transistors (driving TFTs). When substrate 101 having thin film transistors (driving TFTs) is to be prepared (see FIG. 7A), the substrate may be prepared by forming a passivation film and a planarization film on a surface on which driving TFTs are provided.

Pixel electrode 103 is prepared for instance by forming an electrode material film on substrate 101 by sputtering or the like and patterning the electrode material film by etching. A hole injection layer made of transition metal oxide may be formed on pixel electrode 103.

2) FIG. 3B shows the second step. In the second step first bank 105 and second bank 107 are formed on substrate 101.

As described above, first bank 105 defines a linear coating region and second bank 107 defines a pixel region.

In the present invention, the step of forming first bank 105 and second bank 107 includes a step of patterning a resin film and a step of baking the patterned resin. The resin film may be patterned by photolithography. Alternatively, the resin film may be patterned by intaglio printing. By patterning the resin film with intaglio printing or the like, possible damages to other members (e.g., pixel electrode) could be eliminated. Further, the resin film may be patterned by relief printing.

The step of patterning a resin film by photolithography includes the steps of:

i) forming photosensitive resin film A on a substrate (FIG. 4A);

ii) forming photosensitive resin film B on photosensitive resin film A (FIG. 4B); and iii) exposing photosensitive resin films A and B through a halftone mask having different degrees of light transmittance, and developing the exposed photosensitive resin films A and B (FIGS. 4C and 4D).

i) FIG. 4A shows the step i. In the step i, photosensitive resin film A104 is formed on substrate 101. Photosensitive resin film A104 contains a material of second bank 107. The thickness of photosensitive resin film A104 is preferably 0.1-0.5 µm. Formation of the photosensitive resin film on substrate 101 may be achieved by applying a photosensitive resin composition over substrate 101 by spin coating or the like and drying the applied coat of photosensitive resin composition. Drying conditions are not specifically limited; the applied photosensitive resin composition may be kept for 2-3 minutes at 80° C. to be dried.

ii) FIG. 4B shows the step ii. In the step ii, photosensitive resin film B106 is formed on photosensitive resin film A104. Photosensitive resin film B106 contains a material of first bank 105. The thickness of photosensitive resin film B106 is preferably 0.5-3 µm. In addition, photosensitive resin film B106 has different photosensitivity than photosensitive resin film A104. More specifically, when photosensitive resin films A104 and B106 are both negative photosensitive resin films, photosensitive resin film B106 may be made less sensitive than photosensitive resin film A104. On the other hand, when photosensitive resin films A104 and B106 are both positive photosensitive resin films, photosensitive resin film B106 may be made more sensitive than photosensitive resin film A104.

iii) FIGS. 4C, 4C' and 4D show the step iii. In the step iii, photosensitive resin films A104 and B106 are exposed through halftone mask 110 with different degrees of light transmittance.

FIG. 4C shows a case where photosensitive resin films A104 and B106 are both negative photosensitive resin films. In this case, a region where pixel electrode 103 is to be exposed is not irradiated; a region corresponding to second bank 107 is exposed through a halftone mask; and a region corresponding to first bank 105 is directly exposed without mask 110.

At unexposed regions, photosensitive resin films A104 and B106 never cure and are removed by development to expose pixel electrode 103 (FIG. 4D). At regions directly exposed without mask 110, both of photosensitive resin films A104 and B106 cure and thereby first bank 105 is formed as a result of development (FIG. 4D). At regions exposed through a halftone mask, only photosensitive resin film A104 with high sensitivity cures and photosensitive resin film B106 with small sensitivity does not cure (FIG. 4D). As a consequence, photosensitive resin film B106 is removed by development to form second bank 107 (FIG. 4D).

FIG. 4C' shows a case where photosensitive resin films A104 and B106 are both positive photosensitive resin films. In this case, a region where pixel electrode 103 is to be exposed is directly irradiated without using mask 110; a region corresponding to second bank 107 is exposed through a halftone mask; and a region corresponding to first bank 105 is not exposed.

Since photosensitive resin films A104 and B106 show increased solubility at regions directly exposed without mask 110, they are both removed by development to expose pixel electrode 103 (FIG. 4D). At unexposed regions the photosensitive resin films remain cured. Thus, first bank 105 is formed as a result of development (FIG. 4D). At regions exposed through a halftone mask, only photosensitive resin film B106 with high sensitivity shows increased solubility, and photosensitive resin film A104 with low sensitivity remains cured. Thus, photosensitive resin film B106 is exclusively removed by development to form second bank 107 (FIG. 4D).

By differentiating sensitivity between photosensitive resin films A and B, and by stacking photosensitive resin film B containing first bank material onto photosensitive resin film A containing second bank material, the resin films can be precisely patterned to form differently shaped first and second banks in a single development process.

Figure 5A:
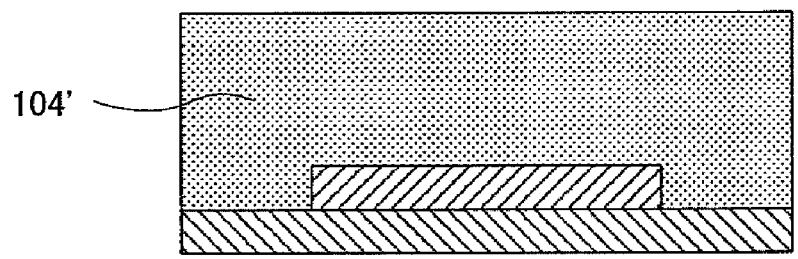
FIGS. 5A to 5C show another example of a method of fabricating first and second banks.
Figure 5B:
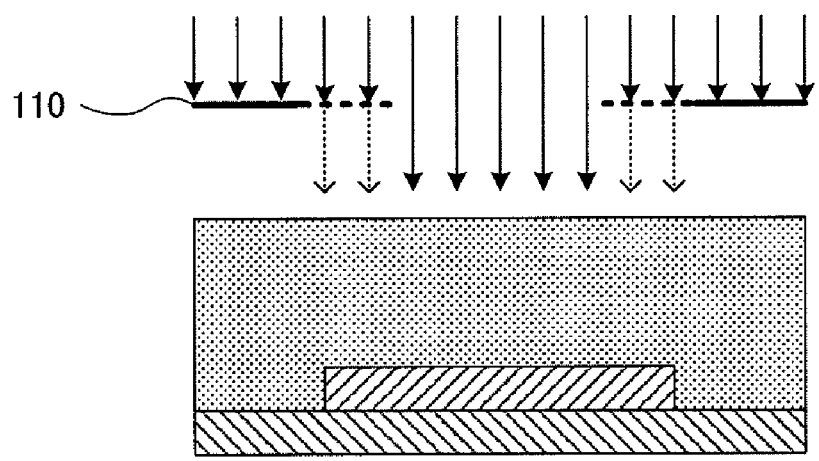
Figure 5C:
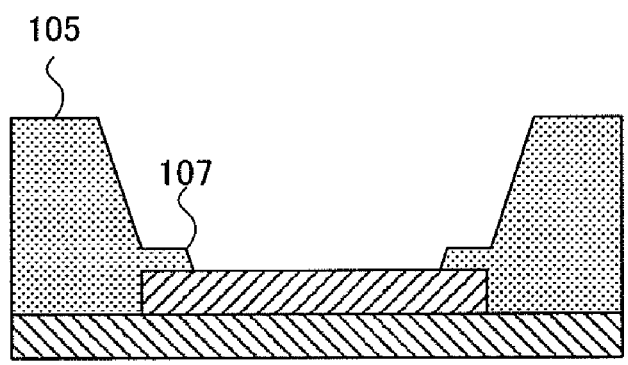

As shown in FIGS. 5A to 5D, the step of patterning a resin film by photolithography may include the steps of:

i) forming photosensitive resin film 104' on a substrate (FIG. 5A); and ii) exposing photosensitive resin film 104' through halftone mask 110 having different degrees of light transmittance, and developing the exposed photosensitive resin film 104' (FIGS. 5B and 5C).

Unlike the method shown in FIGS. 4A to 4D, one photosensitive resin film is formed in the method shown in FIGS. 5A to 5C. This allows simultaneous formation of differently shaped first and second banks from one resin material. Further, because first bank 105 and second bank 107 are made of the same resin material in the method shown in FIGS. 5A to 5C, it is preferable to employ fluorine resins as the material of first bank 105 and second bank 107.

The patterned resin is then baked to form first and second banks. In the case where fluorine resin is employed as the bank material, it is presumed that baking treatment causes fluorine components of the resin film to migrate toward film surface. In this way bank with desired surface wettability is formed. As described above, it is possible to produce a gradient of wettability along the bank height.

In addition, between the second step and below-described third step, a hole injection layer may be formed on a pixel electrode in a region defined by the second bank by applying therein a solution containing PEDOT-PSS and water.

3) FIGS. 3C and 3D shows the third step. In the third step linear organic layer 109 is formed in a coating region. Linear organic layer 109 is formed by drying organic material solution 108 (solution containing an organic material and an organic solvent such as anisole or cyclobenzene) which has been applied in a linear coating region defined by first bank 105 by inkjet printing or the like. Since the upper surface of second bank 107 shows high wettability as described above, organic material solution 108 can be applied in the coating region without being repelled by second bank 107. As the height of second bank 107 from the surface of the underlying layer of organic layer 109 (pixel electrode or hole injection layer) is relatively small, the coating region is less rugged and therefore organic layer 109 with more uniform thickness can be formed.

4) FIG. 3E shows the forth step. In the forth step counter electrode 111 is formed over organic layer 109. Counter electrode 111 may be formed by vapor deposition, sputtering or the like. Prior to formation of counter electrode 111, an electron injection layer may be formed on organic layer 109 by vapor deposition, sputtering or the like.

In this way, with a manufacturing method of the present invention, first and second banks with different wettabilities and shapes can be simultaneously formed. It is thus possible to manufacture an organic EL display panel having uniform thick organic layers more easily.

Hereinafter, Embodiments of the present invention will be described with reference to drawings.

Embodiment 1

In Embodiment 1, a top emission organic EL display panel will be described. Note that the organic EL display panel of Embodiment 1 is an active matrix display panel.

Figure 6A:
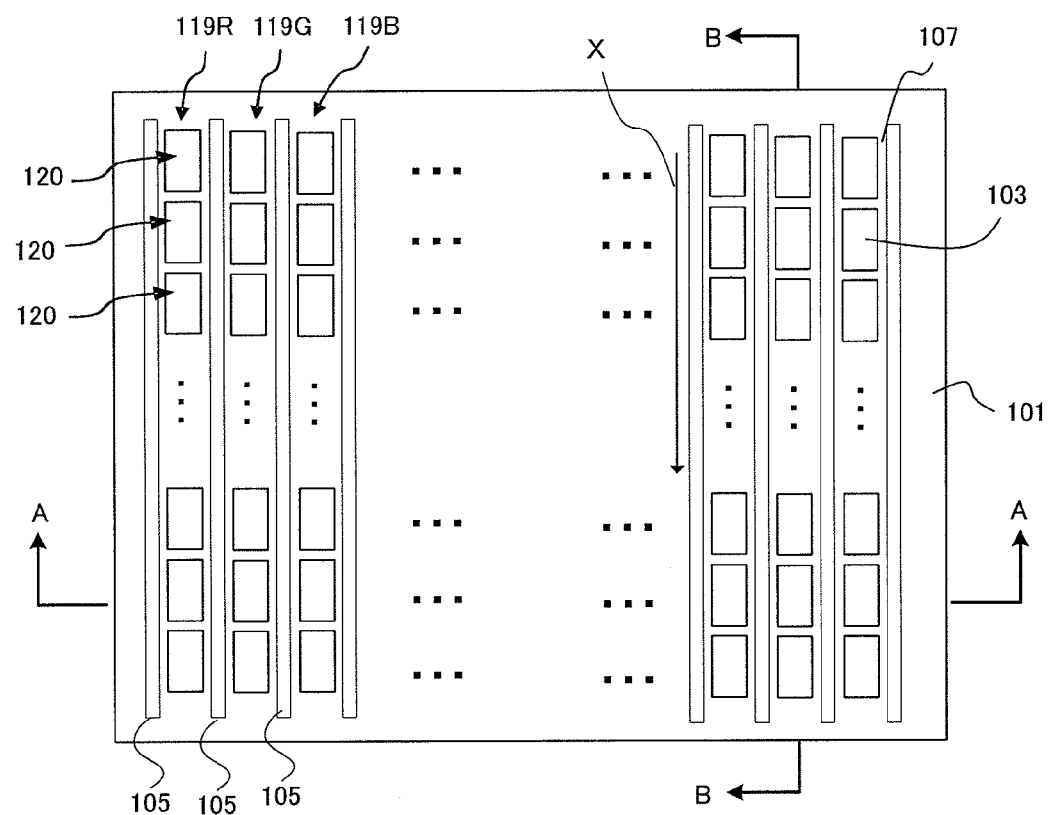
FIGS. 6A and 6B show an organic EL display panel according to an embodiment of the present invention.
Figure 6B:
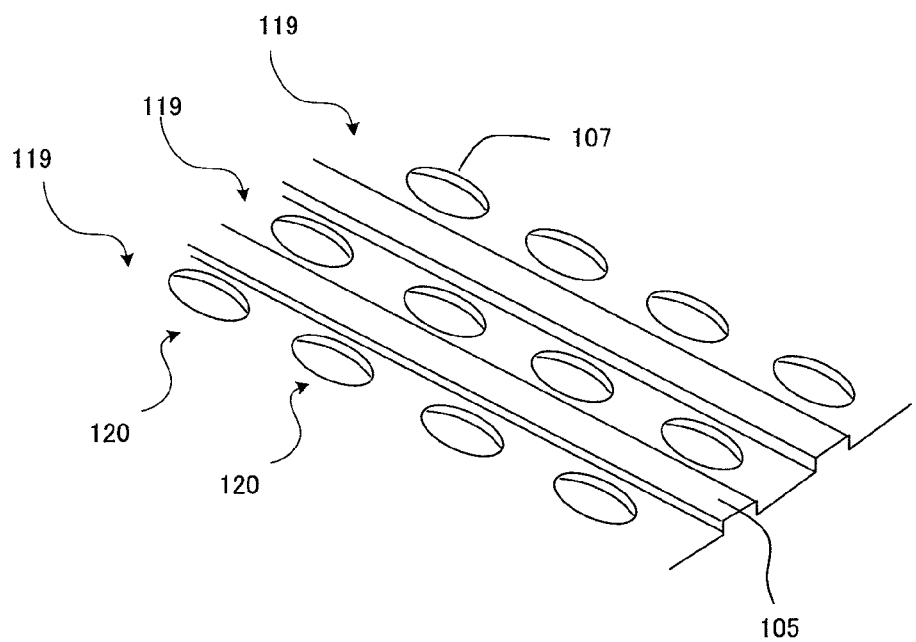

FIG. 6A is a plan view showing an active matrix organic EL display panel of Embodiment 1, where illustrations of a counter electrode and organic luminescent layers are omitted. FIG. 6B is a perspective view showing the organic EL display panel of FIG. 6A.

As shown in FIGS. 6A and 6B, in the organic EL display panel of Embodiment 1, multiple linear banks (first bank) 105 are disposed on substrate 101. First bank 105 defines coating regions 119, which are classified into three types: coating region 119R emitting red light; coating region 119G emitting green light; and coating region 119B emitting blue light. These three different coating regions are alternately arranged. Moreover, second bank 107 which is shorter in height than first bank 105 is disposed on substrate 101. Second bank 107 defines multiple pixel regions 120 in each coating region 119. In this embodiment longitudinal ends of coating regions 119 are not defined by bank.

Figure 7A:
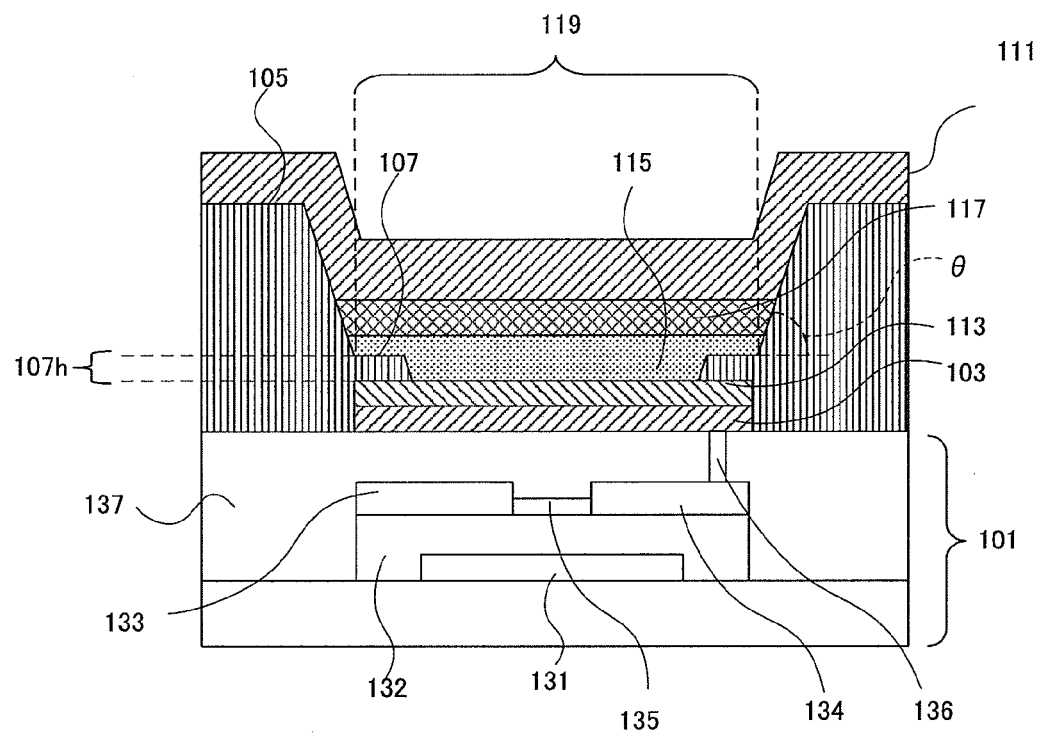
FIGS. 7A and 7B are sectional views showing an organic EL device included in Embodiment 1 of an organic EL display panel.
Figure 7B:
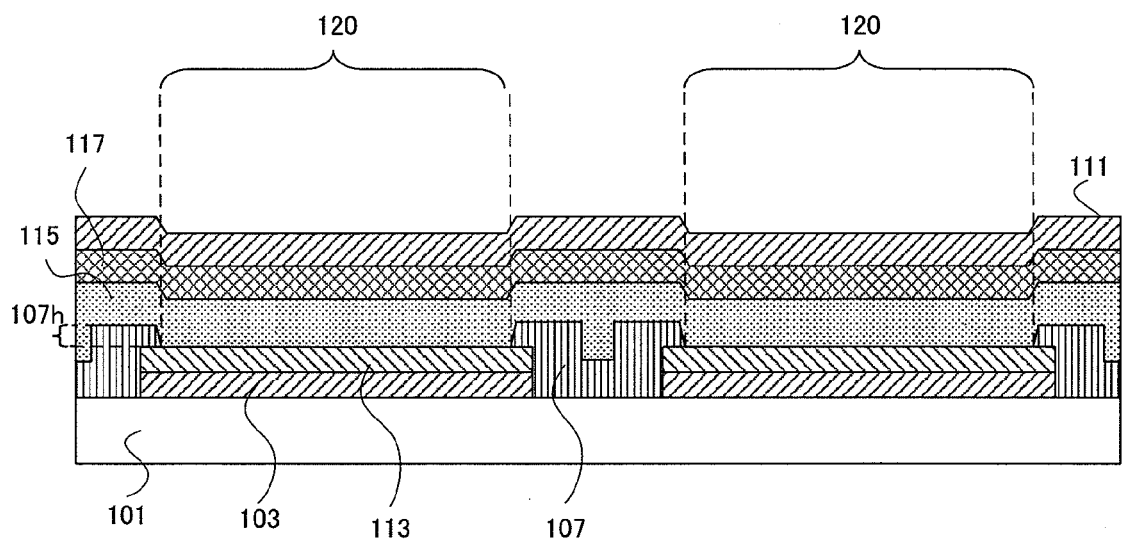

FIG. 7A is an A-A line sectional view of an organic EL device contained in the organic EL display panel of Embodiment 1. FIG. 7B is a B-B line sectional view of organic EL devices, showing sections of two of the organic EL devices.

As shown in FIGS. 7A and 7B, the organic EL device includes substrate 101, pixel electrode 103, hole injection layer 113, linear electron block layer 115, linear organic luminescent layer 117, first bank 105, second bank 107, and counter electrode 111.

Substrate 101 incorporates therein thin film transistors (TFTs), each of which controls light emission of organic luminescent layer 117. The TFTs incorporated in substrate 101 each includes gate electrode 131, gate insulation layer 132, source electrode 133, drain electrode 134, semiconductor layer 135, contact hole 136, and planarization film 137. Pixel electrode 103 is connected to drain electrode 134 via contact hole 136.

Pixel electrode 103 is preferably a reflective pixel electrode formed of an APC film or the like with a thickness of 100-200 nm. Counter electrode 111 is preferably an ITO film.

Hole injection layer 113 is made of transition metal oxide such as tungsten oxide. Hole injection layer 113 may be formed by depositing a transition metal layer by sputtering and patterning the deposited layer by etching.

As shown in FIG. 7B, linear electron block layer 115 is disposed on hole injection layer 113 and second bank 107.

As shown in FIG. 7B, linear organic luminescent layer 117 is disposed on linear electron block layer 115.

First bank 105 defines a region in which electron block layer 115 and organic luminescent layer 117 are to be provided (coating region). First bank 105 has a forward tapered shape. The taper angle θ of first bank 105 is preferably 20-80°, more preferably 30-45°.

Second bank 107 defines pixel region 120 as described above. In this embodiment, height 107h of second bank 107 from the surface of hole injection layer 113 is −0.1 μm to +0.4 μm.

The wettability at the upper surface of first bank 105 is smaller than the wettability at the upper surface of second bank 107. More specifically, anisole contact angle at the top of first bank 105 is 30-60°, and anisole contact angle at the top of second bank 107 is 5-30°.

Thus, in the organic EL display panel of Embodiment 1, since the height of second bank from the surface of the hole injection layer is relatively small, the coating region has flat surface. Moreover, the upper surface of second bank has high wettability. Accordingly, with this Embodiment, it is possible to make uniform the thicknesses of organic layers (electron block layers) which are formed in coating regions by coating method.

Embodiment 2

In Embodiment 1, an example where a hole injection layer made of transition metal oxide is employed has been described. In Embodiment 2, an example where a PEDOT-PSS-containing hole injection layer is employed will be described.

An organic EL display panel of Embodiment 2 is identical to the organic EL display panel of Embodiment 1 except that 1) the hole injection material is PEDOT-PSS and that 2) the positional relationship between second bank and hole injection layer is different. Accordingly, the same members are given the same reference numerals and descriptions thereof are not provided.

FIG. 6A is a plan view showing an active matrix organic EL display panel of Embodiment 2, where illustrations of a counter electrode and organic luminescent layers are omitted. FIG. 6B is a perspective view showing the organic EL display panel of FIG. 6A.

Figure 8A:
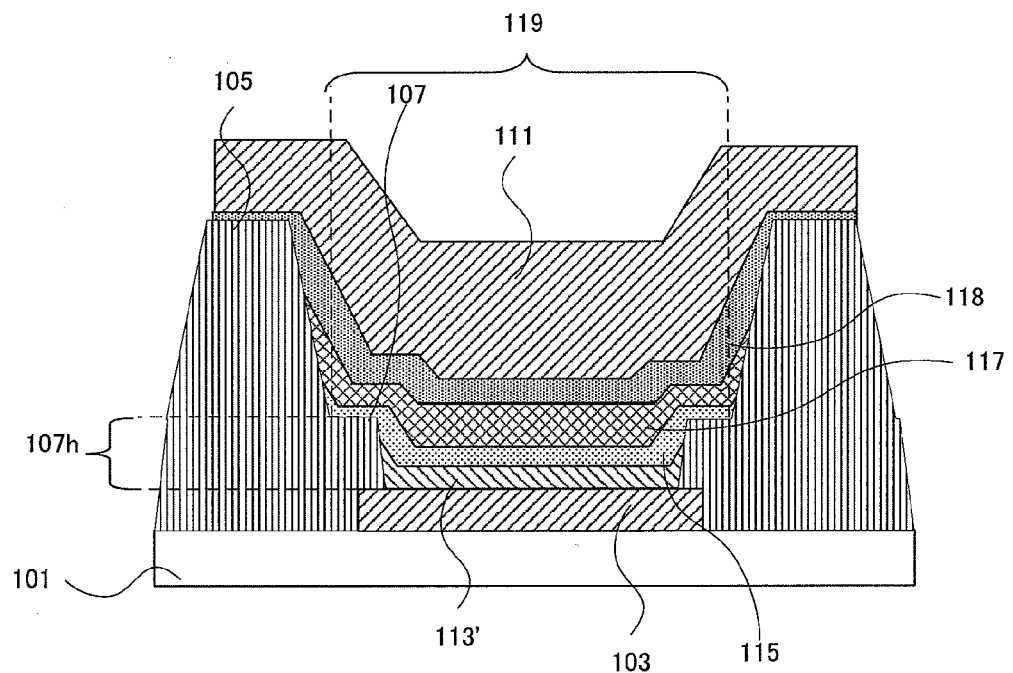
FIGS. 8A and 8B are sectional views showing an organic EL device included in Embodiment 2 of an organic EL display panel.
Figure 8B:
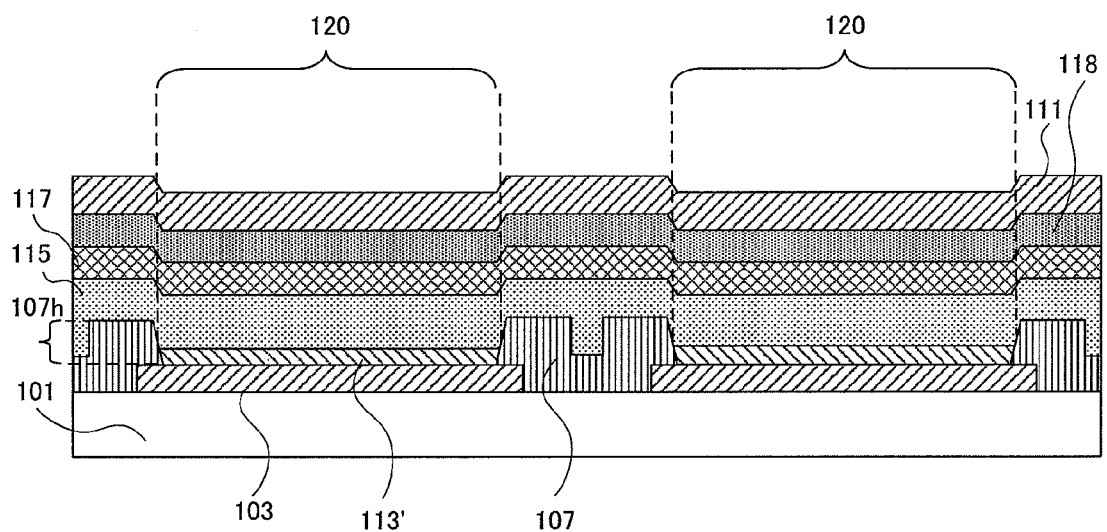

FIG. 8A is an A-A line sectional view of an organic EL device contained in the organic EL display panel of Embodiment 2. FIG. 8B is a B-B line sectional view of organic EL devices, showing sections of two of the organic EL devices.

As shown in FIGS. 8A and 8B, the organic EL device of Embodiment 2 includes substrate 101, pixel electrode 103, hole injection layer 113', linear electron block layer 115, linear organic luminescent layer 117, first bank 105, second bank 107, electron injection layer 118, and counter electrode 111. As described above, Embodiment 2 is identical to Embodiment 1 except that 1) the hole injection material is PEDOT-PSS and that 2) the positional relationship between second bank and hole injection layer is different. Thus, 1) hole injection layer 113' and 2) second bank will be described below.

1) Hole Injection Layer 113'

Hole injection layer 113' contains PEDOT-PSS. As will be described later, hole injection layer 113' is formed by applying in a region defined by second bank 107 an aqueous solution containing PEDOT-PSS. In this way, a separate hole injection layer 113' is disposed by coating method for each pixel region 120 (organic EL device).

Herein, hole injection layer 113', which contains PEDOT-PSS, is formed by coating method as are linear organic layers (electron block layer 115 and organic luminescent layer 117). Thus, linear hole injection layers 113' may be formed in coating regions as are organic layers. However, it is preferable to provide a separate hole injection layer 113' for each pixel region 120; advantages of this will be described below with reference to FIG. 9.

Figure 9:
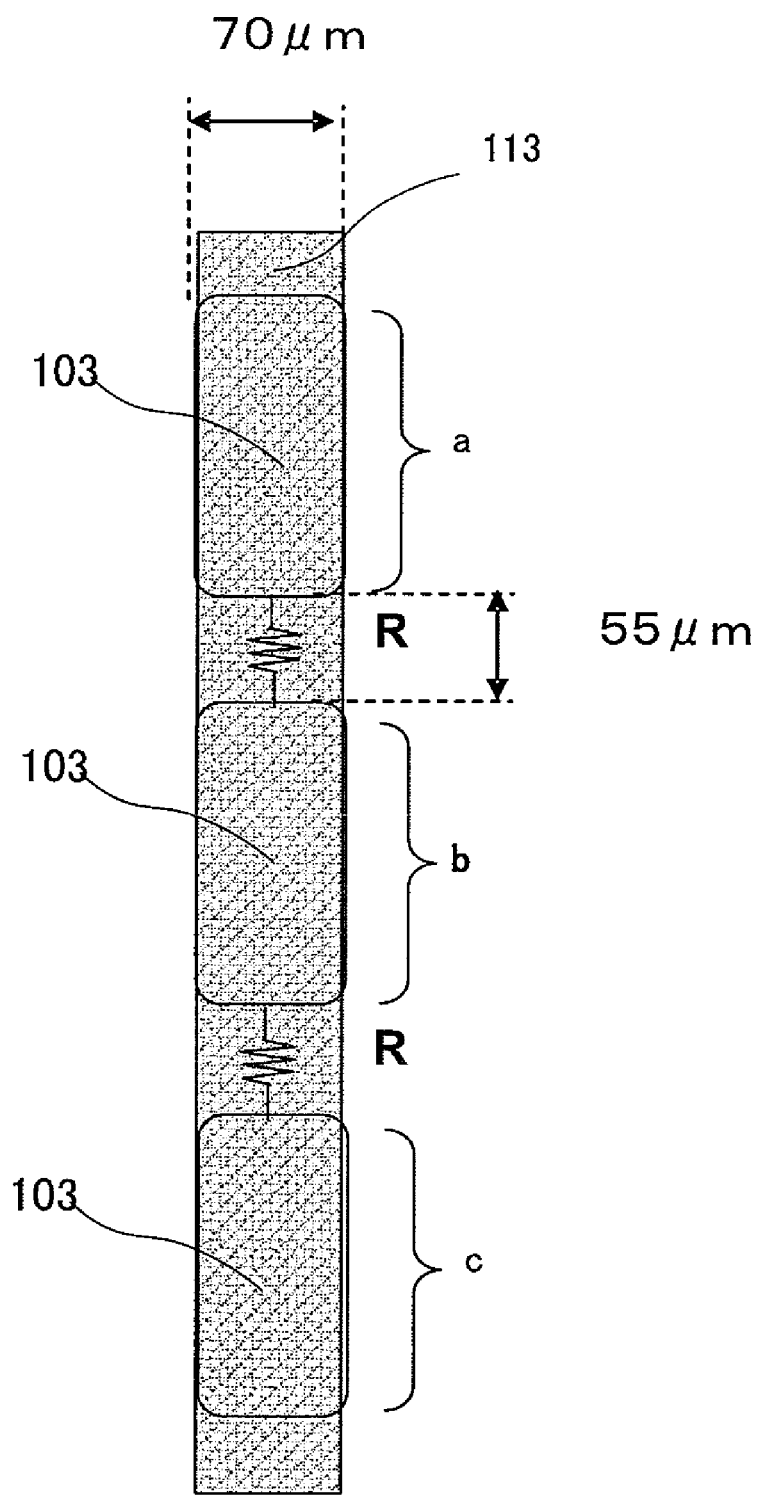
FIG. 9 is a partially enlarged plan view showing an organic EL display panel having a row of hole injection layers containing PEDOT-PSS.

FIG. 9 is a partially enlarged view showing a coating region of an organic EL display panel. As shown in FIG. 9, pixel electrode 103 in each organic EL device is 70 μm in width, and the distance between adjacent pixel electrodes (pixel electrode pitch) is 55 μm. In FIG. 9 hole injection layer 113 is linearly formed so as to cover three organic EL devices a, b, and c.

Equation 1 below represents a relationship between pixel electrode-to-pixel electrode resistance, and specific resistance of hole injection layer (PEDOT-PSS), pixel electrode pitch and section area of hole injection layer.

$$R=\rho L/A \quad \text{[Equation 1]}$$

where R is resistance, ρ is specific resistance of PEDOT-PSS, L is pixel electrode pitch, and A is section area of hole injection layer (PEDOT-PSS)

Assume hole injection layer 113 is 65 nm in thickness, Equation 1 yields an value of resistance R of $1.2 \times 10^5 \rho \Omega$. When a voltage of 6V is applied to organic EL device b under such a condition, the current density of each of organic EL device b becomes 10 mA/cm². Meanwhile, in this case, a current of $5 \times 10^{-2}/\rho$ mA flows in organic EL devices a and c which are arranged next to organic EL device b. At this time, the current density of organic EL devices a and c becomes $3.3 \times 10^2/\rho$ mA/cm².

A proportional relationship establishes between current density and contrast. Thus, the contrast between adjacent organic EL devices becomes equal to their current density ratio. Accordingly, in order to give a contrast of 100,000:1 under the above condition, it is required to set the specific resistance (ρ) of PEDOT-PSS to $3.3 \times 10^6$ Ωcm. Thus, when an hole injection layer is linearly formed so as to cover multiple organic EL devices, the specific resistance (ρ) of PEDOT-PSS needs to be $3.3 \times 10^6$ Ωcm or higher in order to establish a contrast of 100,000:1. This specific resistance value is considerably high compared to those of general hole injection layers made of PEDOT-PSS: $\rho=10^2-10^3$ Ωcm.

Although the specific resistance of a hole injection layer made of PEDOT-PSS can be generally enhanced by increasing the polystyrene sulfonate (PSS) doping level, it leads to shorter lifetime (brightness half-life) of organic EL devices and may deteriorate the performance of an organic EL display panel. Accordingly, hole injection layers with such high specific resistance values may deteriorate the performance of an organic EL display panel.

On the other hand, when a separate hole injection layer is disposed for each organic EL device, the contrast depends on the specific resistance of organic layers (electron block layer and organic luminescent layer) disposed so as to cover multiple organic EL devices. For this reason, there is no need to increase the specific resistance of hole injection layers. Moreover, as organic layers generally have high specific resistance, the contrast is not reduced even when organic layer is disposed in such a way as to cover multiple organic EL devices.

For the reason stated above, it is preferable to provide a separate hole injection layer for each pixel region in order to improve image characteristics of an organic EL display panel.

2) Second Bank 107

In this embodiment second bank 107 serves as a barrier wall which defines pixel region 120 in coating region 119, to define a region in which hole injection layer 113' formed by coating method is to be disposed. The upper surface of second bank 107 has higher wettability than the upper surface of first bank 105.

Since second bank 107 defines a region for hole injection layer 113' to be formed by coating method as described above, the upper surface of second bank 107 is required to be lyophobic to a material solution of hole injection layer 113' (PEDOT-PSS-containing aqueous solution). Because the aqueous solution has relatively high surface tension, the region can be defined even by second bank having high wettability.

As a linear organic layer (electron block layer 115) is formed on second bank 107 by coating method, the upper surface of second bank 107 is, on the other hand, required to be lyophilic to a material solution of electron block layer 115 (solution containing a material of electron block layer 115 and an organic solvent such as anisole).

More specifically, at the upper surface of second bank 107, anisole contact angle is 5-30° and water contact angle is 30-90°. When the wettability of second bank 107 exceeds this range, the material solution of hole injection layer 113' cannot be defined. When the wettability is below this range, the material solution of electron block layer 115 is repelled by second bank 107, resulting in failure to form a uniform thick electron block layer.

In this embodiment, height 107h of second bank 107 from the surface of pixel electrode 103 is 0.1-0.5 μm.

A manufacturing method of an organic EL display panel of Embodiment 2 will be described below with reference to FIGS. 10A to 10G.

Figure 10A:
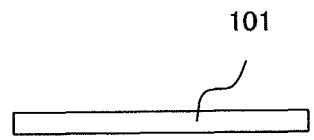
FIG. 10A to 10G show a method of manufacturing an organic EL display panel according to Embodiment 2.
Figure 10B:
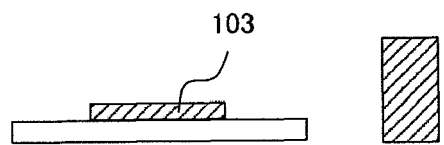
Figure 10C:
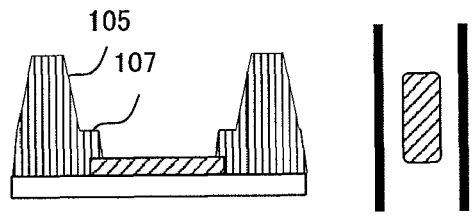
Figure 10D:
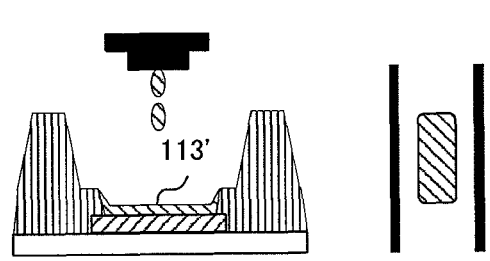
Figure 10E:
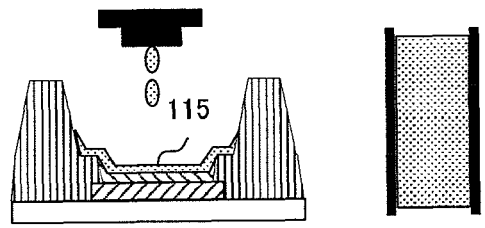
Figure 10F:
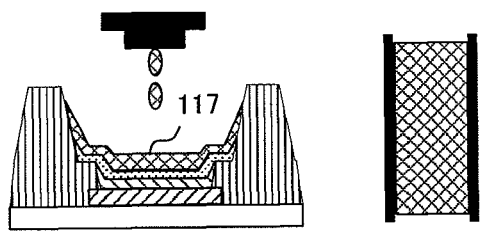
Figure 10G:
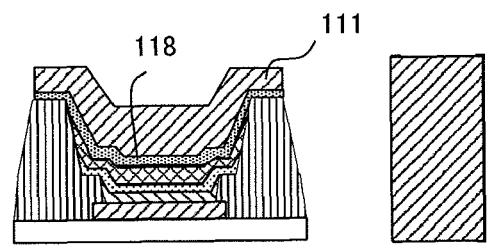

A manufacturing method of an organic EL display panel of Embodiment 2 includes:

1) a first step of providing substrate 101 (FIG. 10A);
2) a second step of arranging pixel electrode 103 on substrate 101 (FIG. 10B);
3) a third step of forming linear first bank 105 for defining a coating region, and second 107 for defining a pixel region (FIG. 10C);
4) a fourth step of forming a hole injection layer in the pixel region defined by second bank 107 (FIG. 10D);
5) a fifth step of forming a linear electron block layer in the linear coating region defined by first bank 105 (FIG. 10E);
6) a sixth step of forming an organic luminescent layer on the electron block layer in the coating region (FIG. 10F); and
7) a seventh step of forming a counter electrode over the organic luminescent layer (FIG. 10G). Each step will be described below.

In the first step, substrate 101 is provided.

In the second step, pixel electrode 103 is arranged on substrate 101.

In the third step, linear first bank 105 for defining coating region 119 and second bank 107 for defining pixel region 120 are formed.

In the forth step, hole injection layer 113' is formed in pixel region 120 defined by second bank 107. Hole injection layer 113' is formed by drying a material solution of hole injection layer 113' (ink containing PEDOT-PSS and water), which has been applied by inkjet printing or the like onto pixel electrode 103 provided in pixel region 120 defined by second bank 107.

In the fifth step, linear electron block layer 115 is formed in linear coating region 119 defined by first bank 105. Electron block layer 115 is formed by drying a material solution of electron block layer 115, which has been applied by inkjet printing or the like in linear coating region 119 defined by first bank 105. As second bank 107 is lyophilic to organic solvents as described above, the material solution of electron block layer 115 can be applied in coating region 119 without being repelled by second bank 107.

In the sixth step, linear organic luminescent layer 117 is formed on electron block layer 115 in coating region 119.

Organic luminescent layer 117 is formed by drying a material solution of organic luminescent layer 117, which has been applied by inkjet printing or the like onto electron block layer 115 in coating region 119.

In the seventh step, counter electrode 111 is formed over organic luminescent layer 117. Prior to formation of counter electrode 111, electron injection layer 118 may be formed on organic luminescent layer 117 by vapor deposition, sputtering or the like.

As the wettability of second bank is appropriately adjusted in this embodiment as described above, it is possible to form a separate PEDOT-PSS containing hole injection layer for each pixel region and to form thereon a linear electron block layer and a linear organic luminescent layer. Therefore, it is made possible to provide a high-contrast, long-lifetime organic EL display panel with no pixel-to-pixel crosstalk.

Embodiment 3

In Embodiments 1 and 2, examples where longitudinal ends of coating regions are not defined have been described. In this embodiment, an example where longitudinal ends of coating regions are also defined by first bank is described. Moreover, Embodiments 1 and 3 provided descriptions of an embodiment where a second bank is disposed between a pixel region and a first bank (see FIGS. 6A and 6B), Embodiment 3 provides descriptions of an embodiment where a second bank is not disposed between a pixel region and a first bank.

An organic EL display panel of this Embodiment is identical to that of Embodiment 1 except that the former includes first bank 105' for defining an end of a coating region and that the former does not include second bank 107 between pixel region 120 and first bank 105. Accordingly, the same members are given the same reference numerals and descriptions thereof are not provided.

Figure 11A:
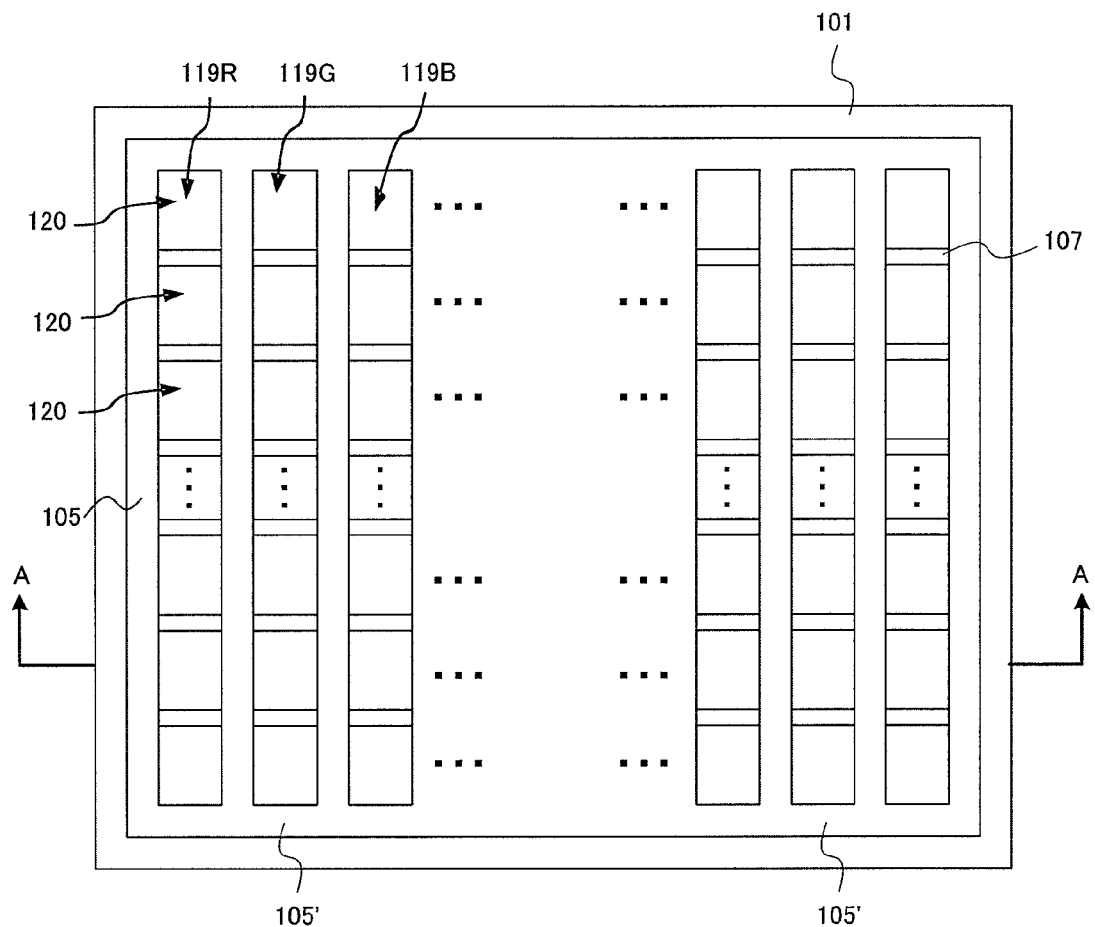
FIGS. 11A and 11B show an organic EL display panel according to Embodiment 3.

FIG. 11A is a plan view showing an active matrix organic EL display panel of this Embodiment, where illustrations of a counter electrode and organic layers are omitted. As shown in FIG. 11A, first banks 105 and 105' define more than one linear coating regions 119. In this embodiment, longitudinal ends of coating region 119 are defined by first banks 105' as shown in FIG. 11A. The height of first bank 105' may be equal to the height of first bank 105. In addition, in contrast to Embodiments 1 and 2 (see FIGS. 6A and 6B), in this embodiment, no second bank 107 is disposed between pixel region 120 and first bank 105; second banks are disposed only between pixel regions 120.

Figure 11B:
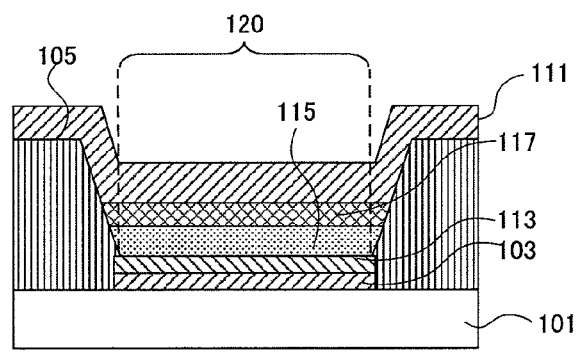

FIG. 11B is an A-A line sectional view showing an organic EL device contained in the organic EL display panel of this Embodiment shown in FIG. 11A. As shown in FIG. 11B, in the A-A line sectional view of an organic EL device, no second bank is provided and pixel region 120 extends to the edges of first bank 105.

Coating region 119 in which an organic luminescent material solution is to be applied is completely sealed by first banks 105'. This prevents unwanted entry of an organic luminescent material solution applied in one coating region into other adjacent coating regions. For example, an organic luminescent material solution to be applied in coating region 119G is prevented from entering adjacent coating region 119B. With this configuration, it is possible to provide an organic EL display panel of higher quality.

In addition, by eliminating second banks between first bank pixel regions, it is possible to widen the pixel regions for increased aperture ratio. Thus, it is possible to provide an organic EL display panel with high aperture ratio.

EXAMPLES

Hereinafter, an organic EL display panel of the present invention will be described with reference to Example and Comparative Example, which however shall not be construed as limiting the scope of the invention thereto.

The following experiment was conducted to demonstrate that the thickness of an organic layer in an organic EL display panel of the present invention is uniform.

An APC film with a thickness of 100-200 nm was deposited onto a 6-inch diameter glass substrate by sputtering and patterned by etching using a resist as a mask, to form reflective pixel electrodes.

Thereafter, a photosensitive acrylic resin film (thickness: 1.0 μm) containing fluorine compound was applied over the glass substrate provided with the reflective pixel electrodes. The film was then exposed through a halftone mask and patterned to define first bank (height: 1.0 μm) and second bank (height: 0.1-0.3 μm), followed by baking treatment (220° C., 1 hr) to finish first and second banks.

By inkjet printing, an ink containing PEDOT-PSS was applied onto the reflective pixel electrode in the pixel region defined by the second bank, and dried to form hole injection layer (thickness: 50-100 nm).

By inkjet printing, a material solution of electron block layer which contains a polyaniline derivative and anisole is applied in the coating region defined by the first bank, and dried and baked to form electron block layer (thickness: 20-50 nm). And finally, by inkjet printing, material solution of organic luminescent layer which contains a polyfluorene derivative and anisole is applied onto the electron block layer, and dried and baked to form organic luminescent layer (thickness: 50-150 nm). In this way, a model of an organic EL display panel of the present invention was fabricated.

Figure 12:
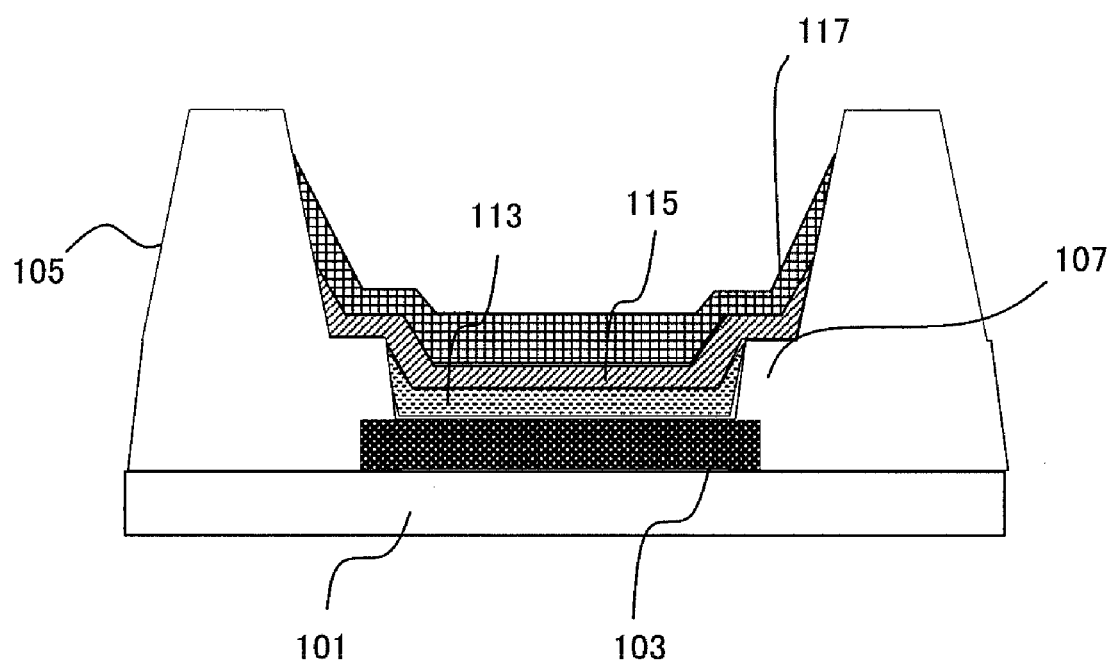
FIG. 12 shows a model of an organic EL display panel manufactured in Example.

In this embodiment, electron injection layer and a counter electrode were not fabricated. Thus, a sectional view of an organic EL device of the organic EL display panel of this embodiment is as shown in FIG. 12.

A film thickness distribution of an organic luminescent layer of one organic EL device in the organic EL display panel model fabricated as described above was measured along the length of coating region (in a direction of the arrow X shown in FIG. 6A). The measurement of film thickness distribution was conducted using P-15 stylus profilometer (KLA-Tencor Corporation).

Figure 13:
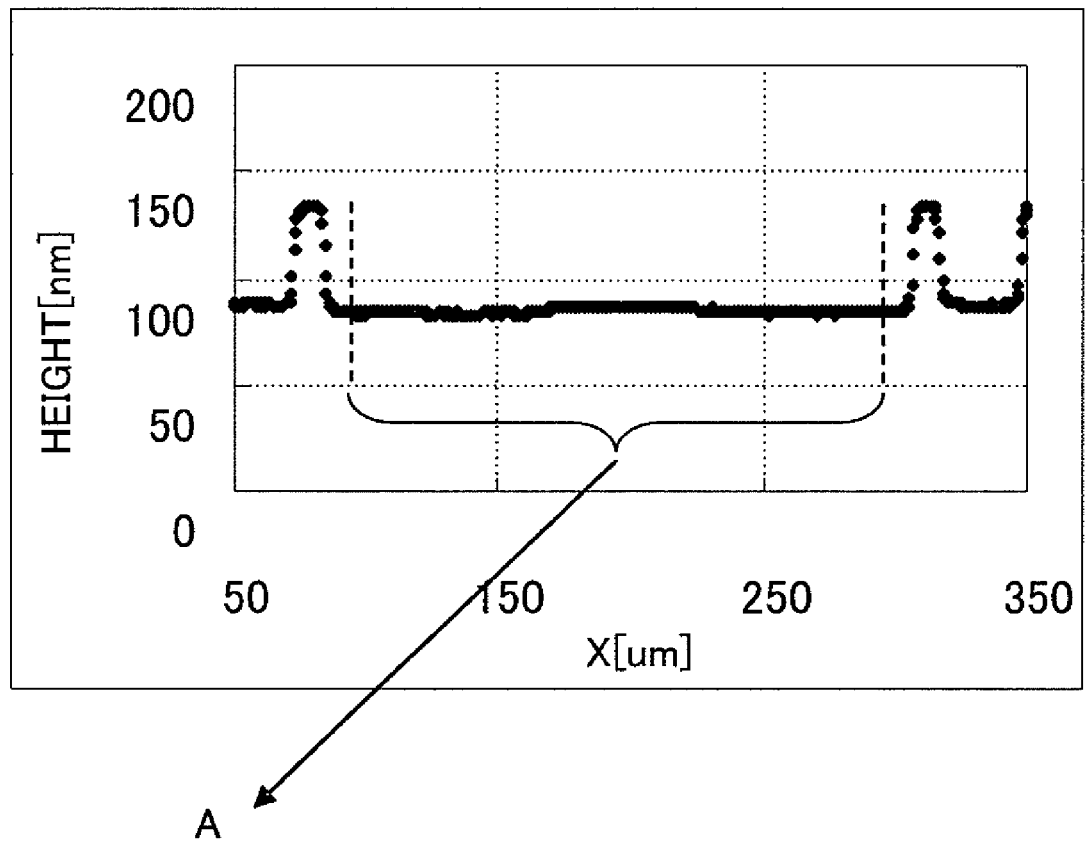
FIG. 13 is a graph of variations in organic luminescent layer thickness in an organic EL display panel of Example.

FIG. 13 is a graph showing the result of the film thickness distribution measurement conducted in Example. In this graph the longitudinal axis represents the thickness of organic luminescent layer, the horizontal axis represents measurement position, and "A" represents the thickness of coating region in the X direction.

In this embodiment, thicknesses of the organic luminescent layer in the coating region varied within ±3%.

Comparative Example

A model of an organic EL display panel of Comparative Example was fabricated in the same manner as in Example except that the height of the second bank was made equal to the height of the first bank (1.0 μm). Namely, in Comparative Example, each pixel region is surrounded on all four sides by banks which are of equal height. Moreover, while a separate hole injection layer is provide for each organic EL device and linear electron block layer and linear organic luminescent layer are formed in Example, in Comparative Example, hole injection layer, electron block layer and organic luminescent layer are all provided on an organic EL device basis.

Figure 14:
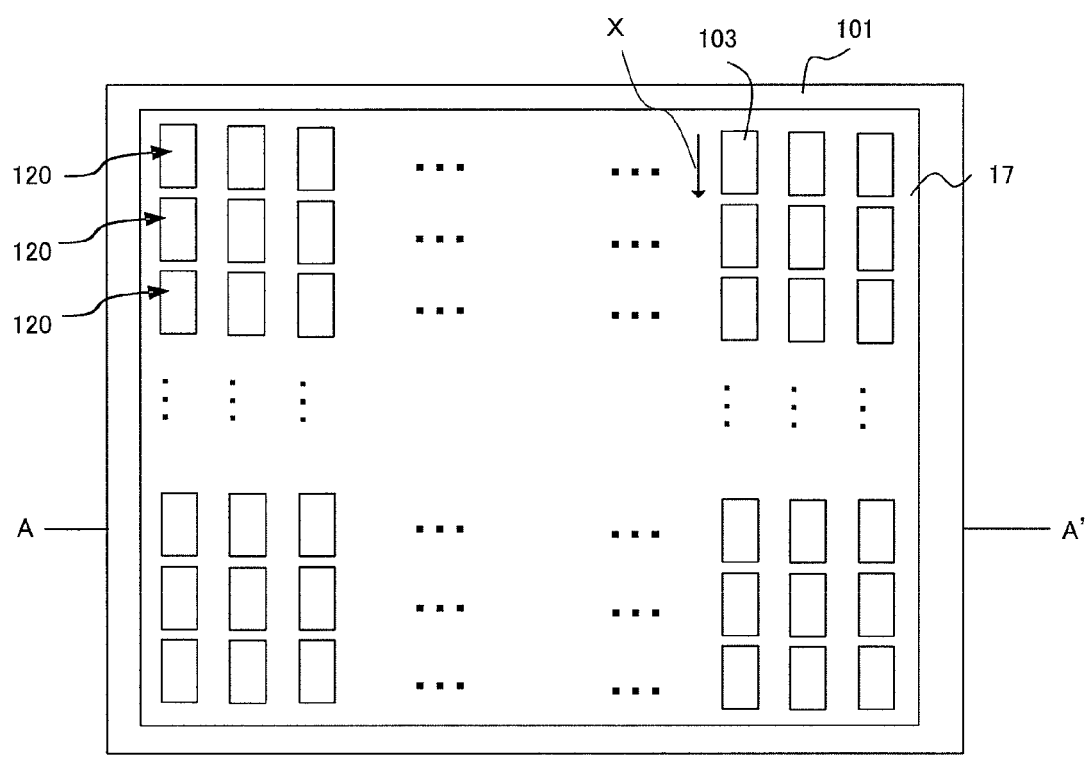
FIG. 14 is a plan view showing a model of an organic EL display panel in Comparative Example.
Figure 15:
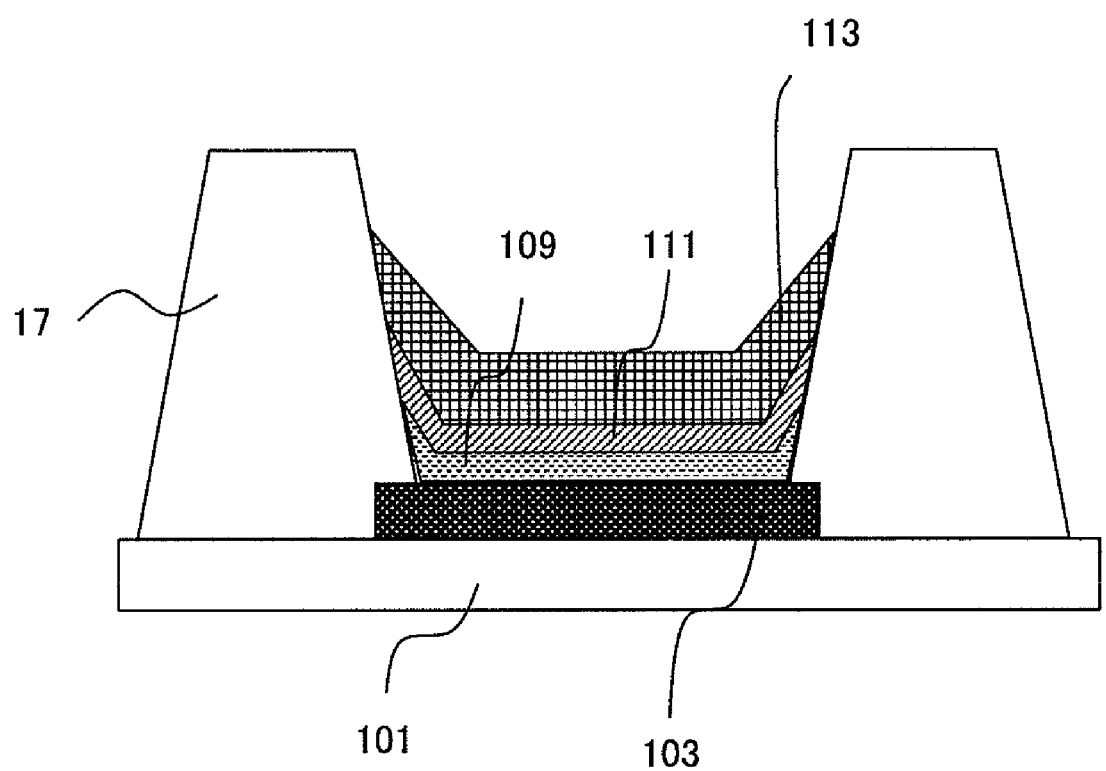
FIG. 15 is a sectional view showing a model of an organic EL display panel in Comparative Example.

The organic EL display panel model of Comparative Example includes only bank 17 for defining pixel regions as shown in FIG. 14. A section of an organic EL device, cut along A-A' line in FIG. 14, has a structure like that shown in FIG. 15.

A film thickness distribution of an organic luminescent layer of one organic EL device in the organic EL display panel model fabricated as described above was measured along the length of coating region (in a direction of the arrow X shown in FIG. 14). Measurement conditions and measurement instrument are the same as those in Example.

Figure 16:
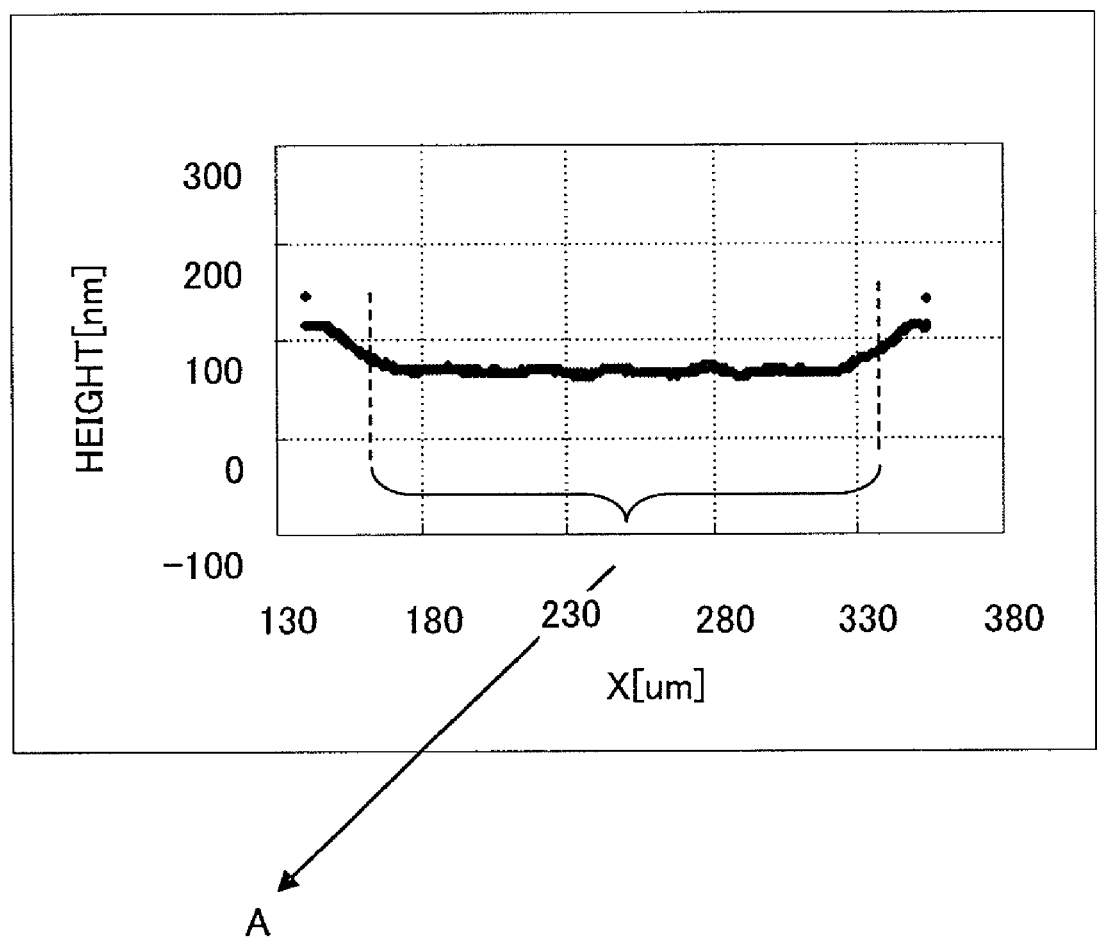
FIG. 16 is a graph of variations in organic luminescent layer thickness in an organic EL display panel of Comparative Example.

FIG. 16 is a graph showing the result of the film thickness distribution measurement conducted in Comparative Example. In Comparative Example, thicknesses of the organic luminescent layer in the coating region varied within ±31%.

The results set forth above suggest that thickness uniformity of organic luminescent layer can be remarkably improved by linearly forming electron block layer and organic luminescent layer, thereby making it possible to provide an organic EL display panel having excellent image characteristics in which brightness variations are small.

The present application claims the priority of Japanese Patent Application No. 2008-149388 filed on Jun. 6, 2008, the entire contents of which are herein incorporated by reference.

INDUSTRIAL APPLICABILITY

The present invention can provide an organic EL display panel having excellent image characteristics.

EXPLANATION OF REFERENCE NUMERALS

1: glass substrate
2: first electrode layer
3: second bank
4: first bank
5: hole injection layer
6: organic luminescent layer
30: pixel region
40: linear region
17: bank
101: substrate
103: pixel electrode
104: photosensitive resin film A
105, 105': first bank
106: photosensitive resin film B
107: second bank
109: organic layer
111: counter electrode
113, 113': hole injection layer
110: halftone mask
115: electron block layer
117: organic luminescent layer
118: electron injection layer
119: coating region
120: pixel region
131: gate electrode
132: gate insulation film
133: source electrode
134: drain electrode
135: semiconductor layer
136: contact hole

The invention claimed is:

1. An organic EL display panel, comprising:
   a substrate;
   a linear first bank which is disposed over the substrate and defines a linear region;
   a second bank which defines two or more pixel regions arranged in the linear region;
   a pixel electrode disposed in the pixel region;
   a linear organic layer which is formed by a coating method over the pixel electrode and the second bank; and
   a counter electrode disposed over the organic layer, wherein
   the first bank is larger in height than the second bank,
   a material of the first bank and the second bank is a fluorine resin,
   the fluorine concentration at the top of the first bank is 4 to 10 atom % and the fluorine concentration at the top of the second bank is 1 to 4 atom %, and
   the fluorine concentration at the top of the first bank is higher than the fluorine concentration at the top of the second bank.

2. The organic EL display panel according to claim 1, wherein the height of the first bank from a surface of the substrate is 0.5-3 μm.

3. The organic EL display panel according to claim 1, wherein a bottom surface of the organic layer contacts the pixel electrode, and the height of the second bank from a surface of the pixel electrode is −0.1 μm to +0.4 μm.

4. The organic EL display panel according to claim 1, further comprising a separate hole injection layer disposed on the pixel electrode in each of the pixel regions, wherein
   a bottom surface of the organic layer contacts the hole injection layer.

5. The organic EL display panel according to claim 4, wherein the hole injection layer contains a transition metal oxide, and the height of the second bank from a surface of the hole injection layer is −0.1 μm to +0.4 μm.

6. The organic EL display panel according to claim 4, wherein the hole injection layer contains polyethylenedioxythiophene, and the height of the second bank from a surface of the pixel electrode is 0.1-0.5 μm.

7. The organic EL display panel according to claim 1, wherein the first bank has a gradient of fluorine concentration along the height thereof, and the fluorine concentration is higher at the top than at the bottom surface thereof.

8. A method of manufacturing an organic EL display panel, comprising:
   providing a substrate on which a pixel electrode is arranged;
   forming a linear first bank which defines a linear region, and a second bank which defines two or more pixel regions arranged in the linear region over the substrate;
   applying a material solution containing an organic EL material in the linear region to form a linear organic layer; and
   forming a counter electrode over the organic layer, wherein
   the first bank is larger in height than the second bank,
   a material of the first bank and the second bank is a fluorine resin,
   the fluorine concentration at the top of the first bank is 4 to 10 atom % and the fluorine concentration at the top of the second bank is 1 to 4 atom %, and
   the fluorine concentration at the top of the first bank is higher than the fluorine concentration at the top of the second bank.

9. The method according to claim 8, wherein forming the first bank and the second bank includes:
   patterning a resin film on the substrate; and
   baking the patterned resin film.

10. The method according to claim 9, wherein patterning the resin film includes:

forming on the substrate, a photosensitive resin film A containing a material of the second bank;

forming, on the photosensitive resin film A, a photosensitive resin film B which contains a material of the first bank and has different sensitivity than the photosensitive resin film A; and exposing the photosensitive resin film A and the photosensitive resin film B through a mask having different degrees of light transmittance, and developing the exposed photosensitive resin film A and the photosensitive resin film B.

11. The method according to claim 9, wherein patterning the resin film includes:

forming, on the substrate, a photosensitive resin film containing a fluorine compound; and exposing the photosensitive resin film through a halftone mask having different degrees of light transmittance, and developing the exposed photosensitive resin film.

* * * * *